(12) United States Patent
Yoshikawa

(10) Patent No.: US 10,260,976 B2
(45) Date of Patent: Apr. 16, 2019

(54) SEMICONDUCTOR DIFFERENTIAL PRESSURE SENSOR AND MANUFACTURING METHOD OF THE SAME

(71) Applicant: Mitsubishi Electric Corporation, Chiyoda-ku, Tokyo (JP)

(72) Inventor: Eiji Yoshikawa, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 101 days.

(21) Appl. No.: 15/443,270

(22) Filed: Feb. 27, 2017

(65) Prior Publication Data

US 2018/0120184 A1   May 3, 2018

(30) Foreign Application Priority Data

Nov. 1, 2016   (JP) .................................. 2016-214079

(51) Int. Cl.
*B81B 3/00*   (2006.01)
*B81C 1/00*   (2006.01)
(Continued)

(52) U.S. Cl.
CPC .......... *G01L 9/0054* (2013.01); *B81B 3/0072* (2013.01); *B81C 1/00666* (2013.01);
(Continued)

(58) Field of Classification Search
CPC ............................ G01L 9/0054; G01L 9/0047
See application file for complete search history.

(56) References Cited

U.S. PATENT DOCUMENTS

| | | | | |
|---|---|---|---|---|
| 5,320,705 A | * | 6/1994 | Fujii | G01L 9/0042 257/E27.006 |
| 5,335,550 A | * | 8/1994 | Satou | G01L 9/0042 29/621.1 |

(Continued)

FOREIGN PATENT DOCUMENTS

| | | |
|---|---|---|
| JP | H07-174654 A | 7/1995 |
| JP | H09-325082 A | 12/1997 |

(Continued)

OTHER PUBLICATIONS

Communication dated Oct. 31, 2017, from Japanese Patent Office in counterpart application No. 2016-214079.

*Primary Examiner* — Ryan D Walsh
(74) *Attorney, Agent, or Firm* — Sughrue Mion, PLLC; Richard C. Turner

(57) ABSTRACT

A semiconductor differential pressure sensor element is such that as strain sensitive elements are disposed only inside a diaphragm, and strain relaxation grooves are provided along the diaphragm, it is difficult for thermal stress caused by expansion or contraction of a case to propagate to the strain sensitive elements, thus suppressing characteristic fluctuations resulting from a change in external temperature. Also, as a configuration is such that a sacrificial column is provided inside a depressed portion, and that the diaphragm is held by the sacrificial column in a diaphragm formation step which thins a second semiconductor substrate and a functional element formation step which repeatedly implements a cleaning step, breakage of the diaphragm can be prevented, thus achieving a significant improvement in yield.

11 Claims, 19 Drawing Sheets

(51) Int. Cl.
   *G01L 9/00*   (2006.01)
   *G01L 19/04*  (2006.01)
(52) U.S. Cl.
   CPC ............ *G01L 9/0047* (2013.01); *G01L 19/04* (2013.01); *B81B 2201/0264* (2013.01); *B81B 2203/0127* (2013.01)

(56) References Cited

U.S. PATENT DOCUMENTS

| | | |
|---|---|---|
| 8,466,523 B2 | 6/2013 | Chiou |
| 2002/0014124 A1 | 2/2002 | Drewes et al. |
| 2005/0172724 A1* | 8/2005 | Sakai ............... G01L 9/0054 73/754 |
| 2011/0278685 A1 | 11/2011 | Yoshikawa et al. |
| 2017/0217755 A1* | 8/2017 | Matsuzawa ............. B81B 3/001 |

FOREIGN PATENT DOCUMENTS

| | | |
|---|---|---|
| JP | 2011-237364 A | 11/2011 |
| JP | 2012-026956 A | 2/2012 |
| JP | 2013-124947 A | 6/2013 |
| JP | 2015-011004 A | 1/2015 |
| JP | 2015-075422 A | 4/2015 |
| JP | 2015-143713 A | 8/2015 |

\* cited by examiner

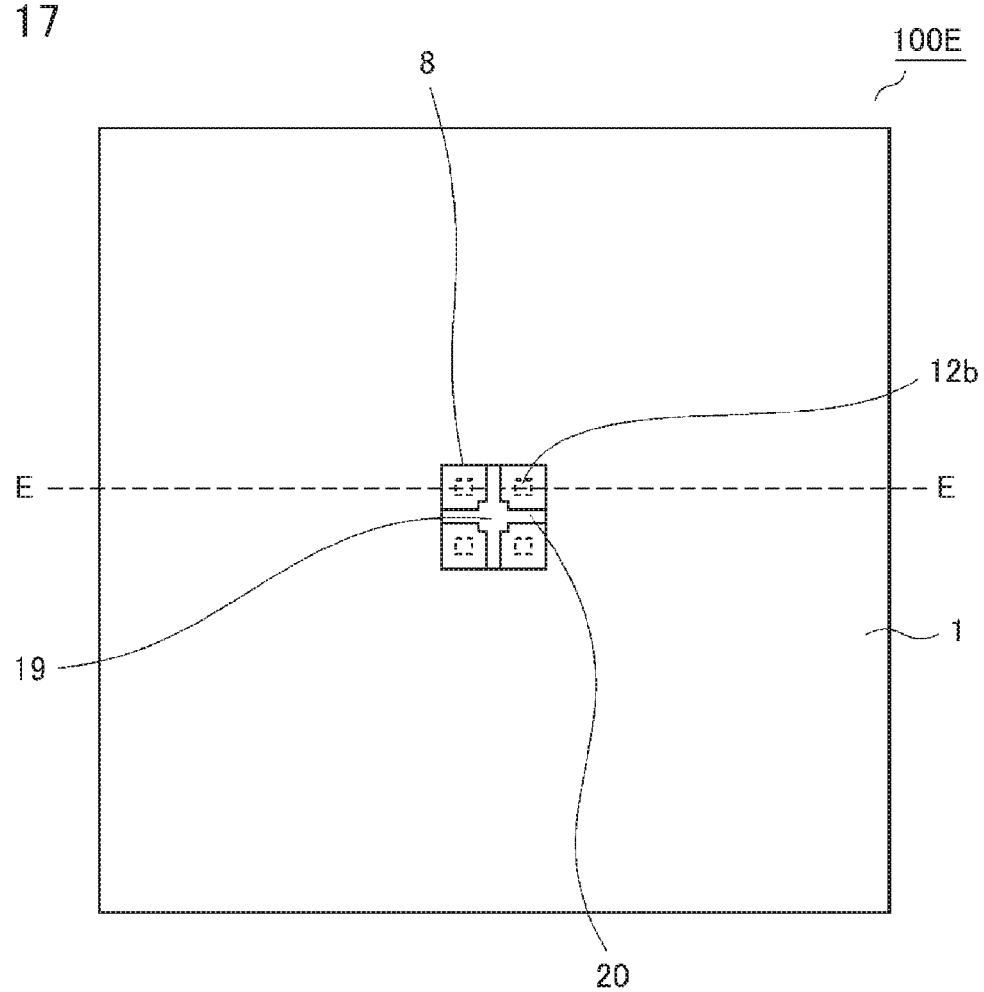

SEMICONDUCTOR DIFFERENTIAL PRESSURE SENSOR AND MANUFACTURING METHOD OF THE SAME

BACKGROUND OF THE INVENTION

Field of the Invention

The present invention relates to a semiconductor differential pressure sensor, which detects the difference between the pressures applied to the front surface and rear surface of a diaphragm, and to a manufacturing method of the sensor.

Description of the Background Art

In recent years, in a mode of transportation, such as a car, the regulations on exhaust gas have been reinforced from the viewpoint of environmental protection. The motorization of a power train is progressing, while a system in which is mounted a heretofore known internal combustion engine is also being improved, and there are an increasing number of cases in which an exhaust gas purification system is mounted in each of a diesel engine and gasoline engine.

A filter, such as a diesel particulate filter (DPF) or a gasoline particulate filter (GPF), is used in this kind of system so as to prevent particulates from being exhausted to the external environment, but in either case, the filter clogs as a result of an increase in the use thereof, leading to a difficulty in obtaining its desired function. Because of this, actions are taken to detect filter clogging at predetermined intervals and restore the filter function. A semiconductor differential pressure sensor according to the invention, being used in, for example, this kind of system, detects filter clogging by measuring the difference between the pressures on the upstream side and downstream side of the filter.

As this kind of semiconductor differential pressure sensor, JP-A-2012-26956 discloses a semiconductor differential pressure sensor having a diaphragm, which includes strain sensitive elements, above a first void portion formed of a first depressed portion provided in superimposed surfaces in a base wherein a second substrate is superimposed on a first substrate. In the semiconductor differential pressure sensor according to this background art, a second depressed portion is provided in an inner bottom portion of the first void portion so as to extend toward the outer surface side of the first substrate, and by the second depressed portion including an opening which connects to the external, the first void portion is in communication with the external.

Also, the semiconductor differential pressure sensor according to the background art is manufactured by the following steps. First, the first depressed portion is formed in the first substrate, and after a protection film is formed in an inner side portion of the first depressed portion, the second depressed portion is formed in the inner bottom portion of the first depressed portion. Subsequently, the second substrate is bonded to a surface of the first substrate in which is formed the first depressed portion, and the second substrate is thinned, thus forming the diaphragm and further forming the strain sensitive elements and a conductive portion. Subsequently, the first substrate is thinned from the other surface side of the base, thus forming an opening portion which connects to the second depressed portion (the details will be described hereafter as a comparison example of a first embodiment of the invention).

In order to achieve the desired function in such a semiconductor differential pressure sensor as in the background art, an assembly structure is essential in which it is possible to reliably hermetically separate and then lead the pressures in two places which are to be measured. The first point of requirements for the assembly structure of the semiconductor differential pressure sensor is that even when pressures are applied to the front surface and rear surface of the diaphragm, a semiconductor differential pressure sensor chip (hereafter abbreviated to the sensor chip) is held without separating from the case, in which the sensor chip is mounted, due to the difference between the pressures.

In the event of a pressure sensor wherein a pressure is applied to only the front surface of a diaphragm, it is sufficient to hold the rear surface side of the sensor chip, but in a semiconductor differential pressure sensor wherein both surfaces of a diaphragm are pressurized, basically, the sensor chip is held by a negative pressure side surface. For the purpose of detecting clogging of the heretofore described kind of filter, such as DPF or GPF, as the upstream side of the filter is basically at a positive pressure, the sensor chip is held by the downstream side surface of the filter, but the pressures are not always the same in magnitude relationship in terms of operation of the system. Also, for other purposes, it is normal that the magnitude relationship between the pressures changes in the two places to be measured. Because of this, it is necessary that the sensor chip is rigidly fixed to the case so as not to separate due to applied pressures.

The second point is that the sensor chip is held to the case in a condition in which the pressures in the two places to be measured are reliably hermetically separated, that is, in a condition in which the front surface side and rear surface side of the diaphragm are reliably hermetically separated. Because of this, it is insufficient simply to apply a die bond material to the lower surface side of the sensor chip, and measures are taken to thickly apply a die bond material also to the side surface of the sensor chip.

The range of temperature in which a semiconductor differential pressure sensor is used is in general as wide as on the order of −40° C. to 130° C., and a resin case repeatedly expands and contracts due to a temperature change in this range. As the sensor chip is rigidly fixed to the case, as previously described, a thermal strain caused by expansion or contraction of the case propagates directly to the sensor chip. On the other hand, there is the problem that as the strain sensitive elements cannot distinguish between a strain caused by a pressure difference, which should originally be measured, and a strain caused by the thermal strain of the case, a measurement error due to the thermal strain occurs.

As no measures to suppress the measurement error due to the thermal strain are taken for the semiconductor differential pressure sensor disclosed in JP-A-2012-26956, and the strain sensitive elements are provided from inside the diaphragm over to the outer peripheral region of the second substrate, it is easy for the thermal strain caused by expansion or contraction of the case to propagate.

Also, a semiconductor differential pressure sensor manufacturing method disclosed in JP-A-2012-26956 has the following problems. The first problem is that in a step of forming the second depressed portion in the first substrate by etching, it is very difficult to apply resist uniformly to the portion in which the first depressed portion is already formed. In JP-A-2012-26956, the depth of the first depressed portion is not particularly limited, but the depth of the first depressed portion which defines the outline of the pressurized diaphragm is preferably on the order of several μm to tens of μm.

When further forming the second depressed portion in the bottom surface of the first depressed portion having this kind of depth, it is necessary to carry out masking, but severe unevenness occurs in the film thickness of resist when using a common spin coating. Also, it is also difficult to photoengrave the pattern of the second depressed portion with high precision by focusing on the bottom surface of the first depressed portion. Even in the event of technologically enabling these steps by taking some measures, they are costly exclusive steps.

As the second problem, there is the problem that after the second substrate and the first substrate in which are formed the first depressed portion and second depressed portion are bonded together, the diaphragm is broken in a step of forming the diaphragm by thinning the second substrate, leading to a reduction in yield. As a method of thinning the second substrate, a method of, after grinding the second substrate with a grinder, mirror polishing the second substrate with a polisher is common, but when the second substrate is ground by a grinder and thinned close to a predetermined thickness, there is the fear that as the first depressed portion and second depressed portion are already formed in the first substrate, the diaphragm deflects largely due to the load of the grinder, eventually resulting in breakage.

A large number of differential pressure sensor chips are simultaneously formed on a semiconductor substrate, and as a semiconductor wafer process for which a high cleaning level is required is set ahead as a postprocess, the semiconductor substrate has to be discarded even when a diaphragm which is one of the sensor chips breaks. That is, the yield in the diaphragm formation step is required to be 100%, but with the manufacturing method described in JP-A-2012-26956, it is very difficult to achieve the requirement.

As the third problem, there is the problem that even in the event that the step of forming the diaphragm ends successfully, the diaphragm is broken due to a cleaning step in the semiconductor wafer process for forming functional elements such as the strain sensitive elements. As typical cleaning methods in the semiconductor wafer process, there are ultrasonic cleaning, megasonic cleaning, brush cleaning, high pressure jet cleaning, and the like, but it is highly possible that all the cleaning methods do serious damage to the diaphragm. Particularly in the megasonic cleaning, as the resonance frequency of the diaphragm is proximate to a megasonic frequency, it is easy for the diaphragm to break due to the resonance.

Furthermore, the fourth problem is that as the opening communicating with the external is provided after forming functional elements, such as the strain sensitive elements and the electrodes, there is the possibility that the diaphragm breaks in the step of thinning the first substrate. In the step, as the semiconductor substrate is held by bringing the front surface of the diaphragm into contact with the grinding/polishing heads of the grinder and polisher, it is easy for the diaphragm to break due to the biting of foreign substances, the impact of abrasives or dust when grinding and polishing, or the like. In order to protect the functional elements when grinding and polishing, heretofore, measures have been taken to stick a protection tape to the front surface of the second substrate having the diaphragm, but in some cases, the diaphragm also breaks when separating the protection tape.

In a differential pressure sensor for the purpose of detecting a minute pressure difference, as the diaphragm is designed to be thin and large, it is more highly possible that the diaphragm breaks in these steps. Breakage of the diaphragm in the manufacturing steps is a very serious problem such that the breakage does damage not only to relevant products, but also to other products manufactured on the same line and to a manufacturing device.

SUMMARY OF THE INVENTION

The invention, having been contrived to solve the heretofore described kinds of problems, has for an object to obtain a highly reliable semiconductor differential pressure sensor which can stably carry out a high precision measurement in as wide a temperature range as on the order of −40° C. to 130° C. Also, it is another object of the invention to provide a manufacturing method whereby it is possible to manufacture the semiconductor differential pressure sensor at low cost and high yield.

A semiconductor differential pressure sensor according to the invention includes a semiconductor differential pressure sensor element wherein one main surface of a first semiconductor substrate and one main surface of a second semiconductor substrate are bonded together via an oxide film formed on the second semiconductor substrate. The first semiconductor substrate has a depressed portion provided in the one main surface and a pressure lead hole which brings the depressed portion into communication with the external on the side of another main surface. The second semiconductor substrate has a diaphragm defined by the outline of the depressed portion, strain sensitive elements disposed in portions of another main surface inside the diaphragm, electrodes disposed in a frame portion outside the diaphragm, and diffusion wiring which electrically connects the strain sensitive elements and electrodes.

Also, a semiconductor differential pressure sensor according to the invention includes a semiconductor differential pressure sensor element wherein one main surface of a first semiconductor substrate and one main surface of a second semiconductor substrate are bonded together via an oxide film formed on the second semiconductor substrate. The first semiconductor substrate has a depressed portion provided in the one main surface, stress relaxation grooves provided around and along the depressed portion, and a pressure lead hole which brings the depressed portion into communication with the external on the side of another main surface. The second semiconductor substrate has a diaphragm defined by the outline of the depressed portion, strain sensitive elements disposed in portions of another main surface inside the diaphragm, electrodes disposed in a frame portion outside the diaphragm, and diffusion wiring which electrically connects the strain sensitive elements and electrodes.

Also, a semiconductor differential pressure sensor manufacturing method according to the invention is a manufacturing method of a semiconductor differential pressure sensor wherein one main surface of a first semiconductor substrate, which has a depressed portion, and one main surface of a second semiconductor substrate are bonded together via an oxide film, the second semiconductor substrate has a diaphragm defined by the outline of the depressed portion, and the depressed portion is in communication with the external on the side of another main surface of the first semiconductor substrate through the pressure lead hole. The method includes a depressed portion formation step which forms the depressed portion, which has a sacrificial column, by etching a region of the one main surface of the first semiconductor substrate, in which to form the depressed portion, leaving one portion; a bonding step which bonds the one main surface of the first semiconductor substrate, in which are formed the depressed portion and sacrificial column, and the one main surface of the second semiconductor substrate, which has thereon the oxide film;

a diaphragm formation step which forms the diaphragm by thinning the second semiconductor substrate to a predetermined thickness from the side of another main surface; a functional element formation step which forms, on the second semiconductor substrate in which is formed the diaphragm, strain sensitive elements disposed inside the diaphragm, electrodes disposed in a frame portion outside the diaphragm, and diffusion wiring which electrically connects the strain sensitive elements and electrodes; and a pressure lead hole formation step which forms the pressure lead hole and at the same time removes the sacrificial column by etching the first semiconductor substrate so as to pass through from the other main surface to a bottom surface of the depressed portion.

According to the semiconductor differential pressure sensor of the invention, as a configuration is such that the strain sensitive elements are disposed only inside the diaphragm and electrically connected by the diffusion wiring to the electrodes disposed in the frame portion outside the diaphragm, it is difficult for thermal stress caused by expansion or contraction of a case, in which a semiconductor differential pressure sensor element is mounted, to propagate to the strain sensitive elements, thus suppressing characteristic fluctuations resulting from a change in external temperature, and it is hence possible to stably carry out a high precision measurement even in as wide a temperature range as on the order of −40° C. to 130° C.

Also, according to the semiconductor differential pressure sensor of the invention, as a configuration is such that the strain sensitive elements are disposed only inside the diaphragm, and are electrically connected to the electrodes disposed in the frame portion outside the diaphragm by the diffusion wiring, it is difficult for thermal stress caused by expansion or contraction of a case, in which a semiconductor differential pressure sensor element is mounted, to propagate to the strain sensitive elements. Furthermore, as the propagation of thermal stress, caused by expansion or contraction of the case, to the strain sensitive elements can be effectively blocked by providing the stress relaxation grooves along the diaphragm, characteristic fluctuations resulting from a change in external temperature are suppressed, and it is hence possible to stably carry out a high precision measurement even in as wide a temperature range as on the order of −40° C. to 130° C.

Also, according to the semiconductor differential pressure sensor manufacturing method of the invention, as a configuration is such that the sacrificial column is provided in an inner portion of the depressed portion, and that the diaphragm is held by the sacrificial column in the diaphragm formation step, which thins the second semiconductor substrate, and in the functional element formation step, breakage of the diaphragm in the steps can be prevented, thus achieving a significant improvement in yield. Furthermore, as the sacrificial column can be formed at the same time as the formation of the depressed portion, and can be removed at the same time as the formation of the pressure lead hole, there is no increase in the number of steps for forming and removing the sacrificial column, causing no increase in manufacturing cost. Also, as a configuration is such that the pressure lead hole is formed by etching the first semiconductor substrate from the side of the other main surface thereof to the bottom surface of the depressed portion, it is possible to form a high precision pressure lead hole using inexpensive and simple steps. Furthermore, it is not necessary to grind or polish the first semiconductor substrate after forming the diaphragm and functional elements, breakage of the diaphragm and functional elements can be prevented, thus achieving an improvement in yield.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 17 is a bottom view showing the semiconductor differential pressure sensor element according to the sixth embodiment of the invention.

DETAILED DESCRIPTION OF THE PREFERRED EMBODIMENTS

First Embodiment

Figure 1A:
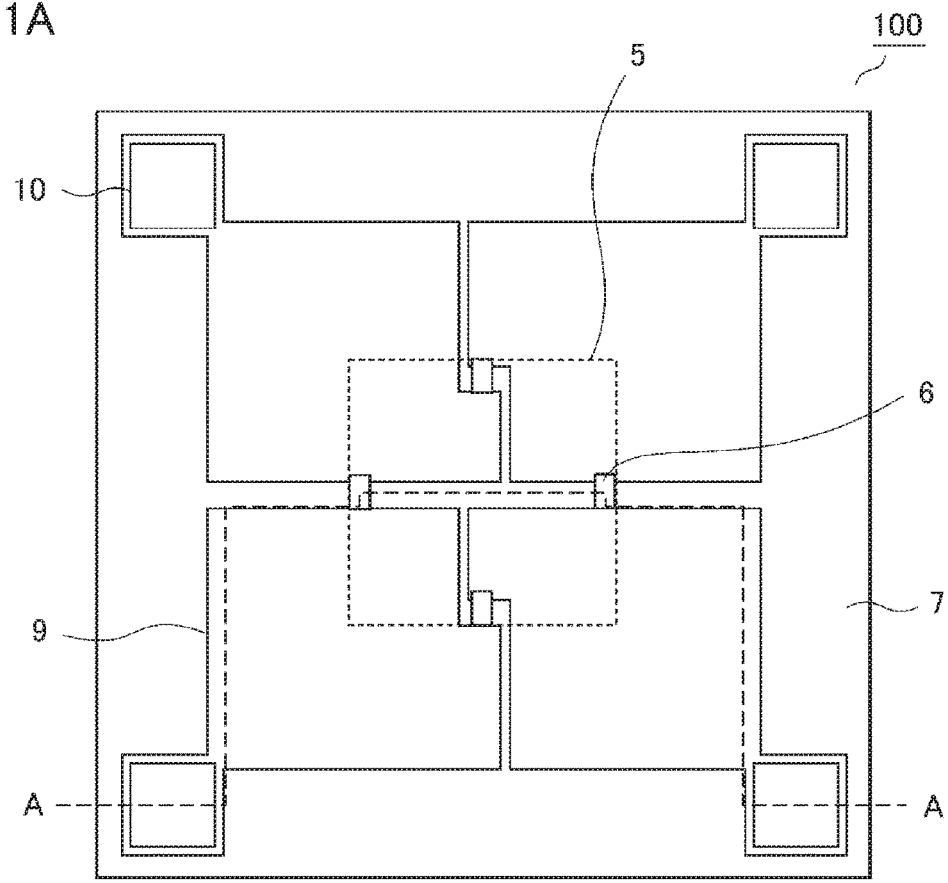
FIGS. 1A and 1B are a plan view and sectional view showing a semiconductor differential pressure sensor element according to a first embodiment of the invention.
Figure 1B:
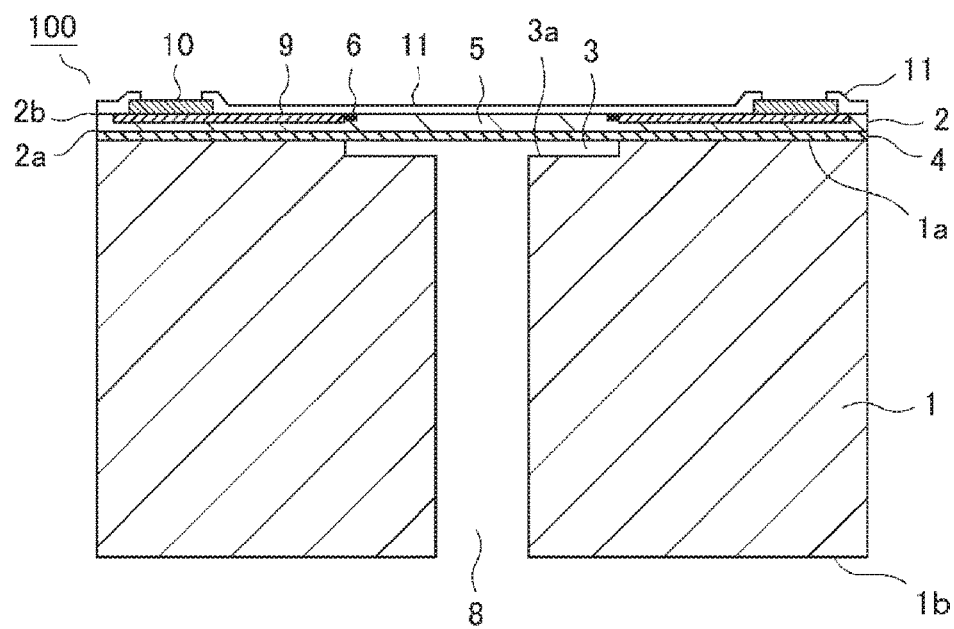
Figure 2:
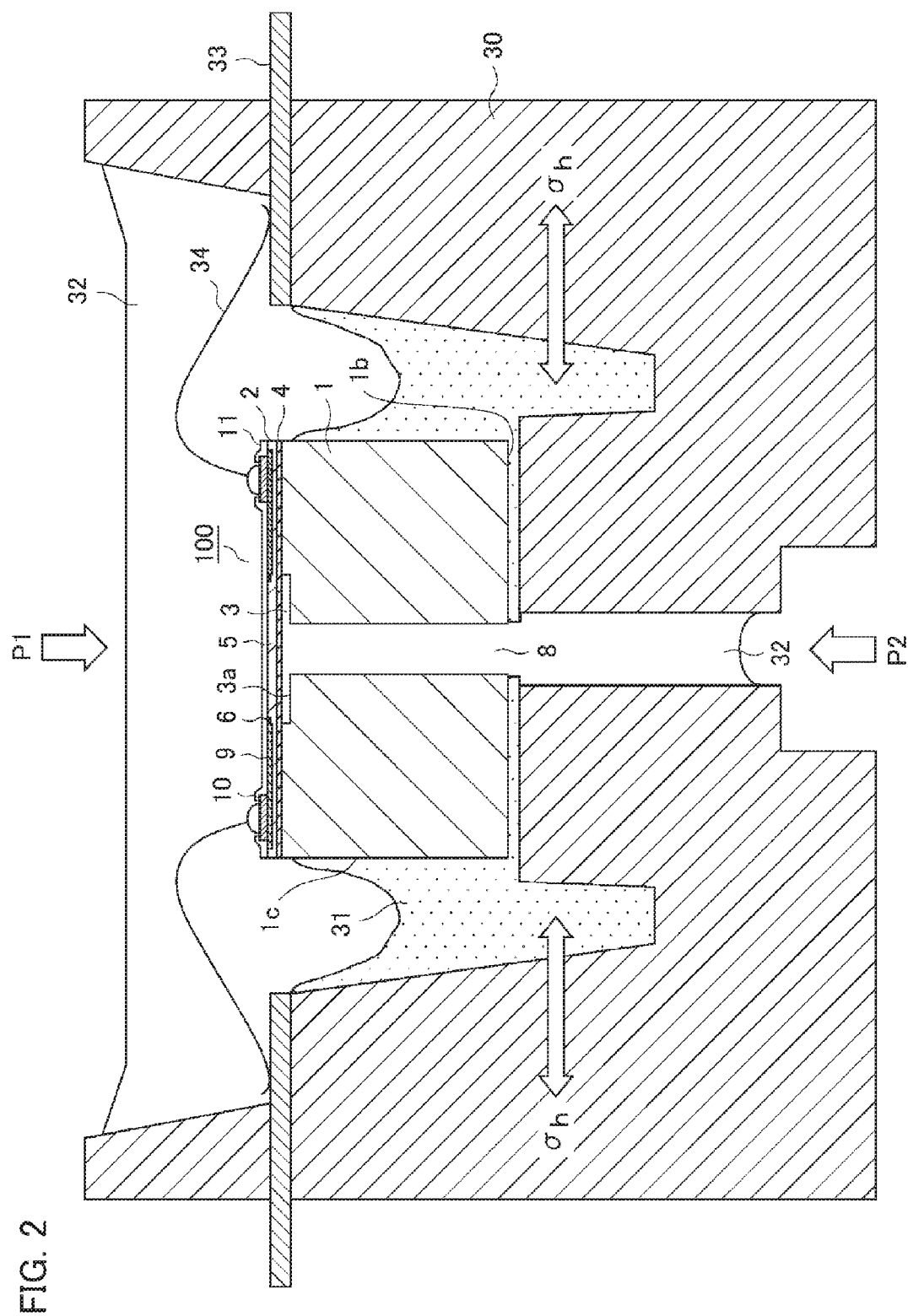
FIG. 2 is a sectional view showing an assembly structure of a semiconductor differential pressure sensor according to the first embodiment of the invention.

Hereafter, a description will be given, based on the drawings, of a semiconductor differential pressure sensor according to a first embodiment of the invention. FIG. 1A is a plan view showing the semiconductor differential pressure sensor according to the first embodiment, FIG. 1B is a sectional view of the portion shown by A-A in FIG. 1A, and FIG. 2 is a sectional view showing an assembly structure of the semiconductor differential pressure sensor according to the first embodiment. In the individual drawings, identical and equivalent portions are given identical signs.

The semiconductor differential pressure sensor according to the first embodiment includes a semiconductor differential pressure sensor element 100 wherein one main surface 1a of a first semiconductor substrate 1 and one main surface 2a of a second semiconductor substrate 2 are bonded together via an oxide film 4. The first semiconductor substrate 1 has a depressed portion 3 provided in the main surface 1a and a pressure lead hole 8 which brings the depressed portion 3 into communication with the external on the side of another main surface 1b of the first semiconductor substrate 1. The outline of the depressed portion 3 is typically of a square shape, and the size thereof is set in accordance with a pressure measurement range of the semiconductor differential pressure sensor. Also, the depth of the depressed portion 3 is not particularly limited, but is preferably on the order of several μm to tens of μm from a processing standpoint. Also, the shape of the pressure lead hole 8 is typically a square cylinder.

The oxide film 4 formed on the second semiconductor substrate 2 corresponds to a buried oxide film (a BOX layer) of a SOI (Silicon on Insulator) wafer. In the case of a semiconductor differential pressure sensor for the purpose of micro differential pressure measurement, measurement precision decreases when the thickness of the oxide film 4 is excessively larger than the thickness of a diaphragm 5. Because of this, the thickness of the oxide film 4 is preferably as small as possible so as not to affect formation of the pressure lead hole 8, or the like, and is, for example, on the order of 0.5 μm to 1.0 μm.

The second semiconductor substrate 2 is thinly polished and has in the central portion thereof the diaphragm 5 whose perimeter is defined by the outline of the depressed portion 3. The semiconductor differential pressure element 100 is of a structure in which the pressure lead hole 8 formed in the first semiconductor substrate 1 is in communication with the depressed portion 3 opposite to the diaphragm 5, thereby leading to the diaphragm 5 a pressure applied from the side of the main surface 1b which is the rear surface of the first semiconductor substrate 1.

Strain sensitive elements 6 which detect a strain occurring in the diaphragm. 5 are disposed inside the diaphragm 5. The strain sensitive elements 6, which are typically piezoresistors, are electrically connected to each other via diffusion wiring 9, thus configuring a Wheatstone bridge circuit. Electrodes 10 for power supply and signal extraction are formed one at each terminal of this bridge.

The electrodes 10 are disposed in an outer frame portion 7 which is a frame portion outside the diaphragm 5, and are electrically connected to the strain sensitive elements 6 by the diffusion wiring 9. The area and thickness of the diaphragm 5 are designed considering a range of pressure to be measured, the sensitivity of the strain sensitive elements 6, and the like, but the diaphragm 5, for example, when used for measuring 10 kPa in full scale, is of a square shape with a side length of about 1.3 mm and a thickness of 10 μm.

The semiconductor differential pressure sensor element 100 configured as heretofore described is mounted in a resin case 30, as shown in FIG. 2. In FIG. 2, P1 shows a pressure applied to the front surface side of the semiconductor differential pressure sensor, and P2 shows a pressure applied to the rear surface side. Also, in the drawing, the arrow shown by σh shows thermal stress applied to the case 30. The semiconductor differential pressure sensor element 100 is rigidly fixed to the resin case 30 by a die bonding material 31 so as not to separate due to a differential pressure (P1-P2). Also, in order to hermetically separate the pressures P1 and P2, the die bonding material 31 is provided not only on the lower side main surface 1b of the first semiconductor substrate 1 but also on a side surface 1c.

The electrodes 10 of the semiconductor differential pressure sensor element 100 are connected to a conductive portion 33 of the case 30 by bonding wires 34. Furthermore, in order to protect the semiconductor differential pressure sensor element 100 from a pressure medium, although depending on the purpose, a gel 32 is provided in inner portions of the pressure lead hole 8 on the front surface side and rear surface side of the semiconductor differential pressure sensor. As the material of the gel 32, a silicon-based gel, a fluorine-based gel, or the like is appropriately selected depending on, for example, the corrosiveness of the pressure medium.

The resin case 30 is superior in cost and workability, but as the case 30 expands or contracts due to a change in temperature of the external environment, the thermal stress from the case 30 propagates to the semiconductor differential pressure sensor element 100 via the die bonding material 31. When the strain sensitive elements 6 are disposed so as to lap over the outer frame portion 7, a thermal strain caused by the thermal stress σh propagated from the case 30 is detected superimposed on a strain of the diaphragm 5, caused by the pressure difference (P1-P2), which should originally be measured, causing a measurement error. The semiconductor differential pressure sensor according to the first embodiment is such that in order to suppress this kind of measurement error, the strain sensitive elements 6 are disposed only on the inner side of the diaphragm 5 to which it is difficult for the thermal stress from the case 30 to propagate.

Figure 18A:
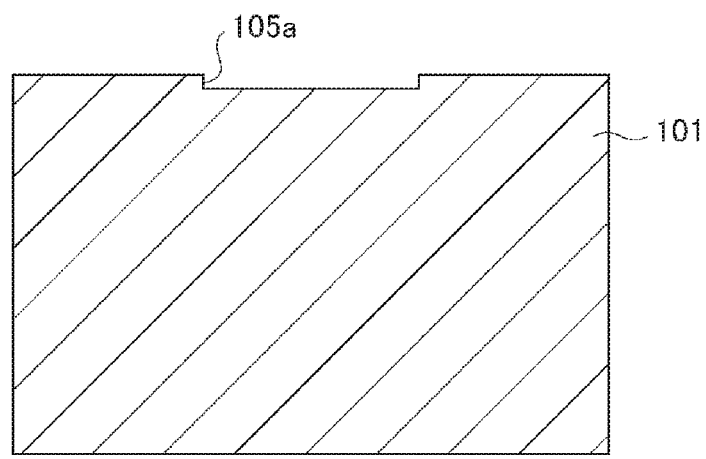
FIGS. 18A to 18C are sectional views showing a manufacturing method of a heretofore known semiconductor differential pressure sensor element which is a comparison example of the invention.
Figure 18B:
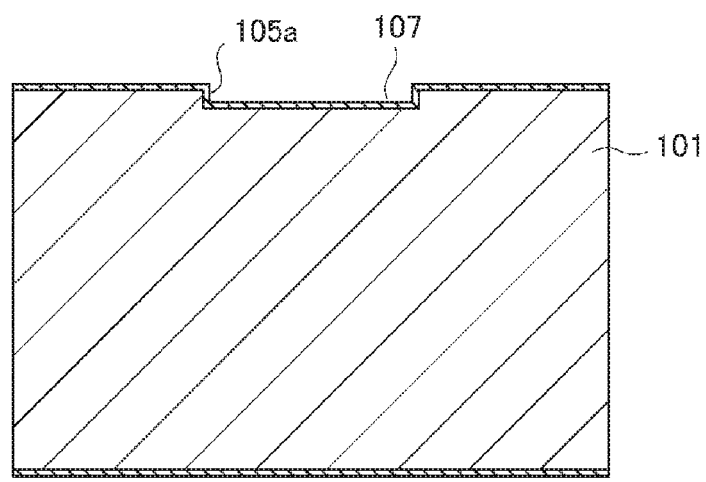
Figure 18C:
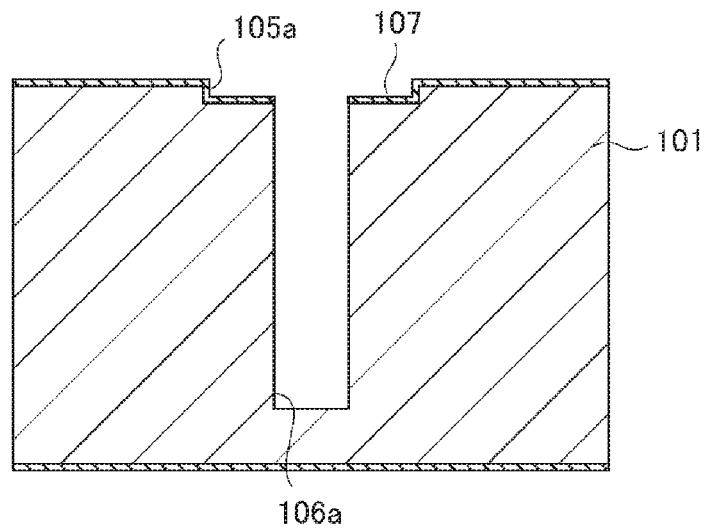

Before describing a manufacturing method of the semiconductor differential pressure sensor element 100 according to the first embodiment, a brief description will be given, using FIGS. 18A to 20B, of a manufacturing method of a heretofore known semiconductor differential pressure sensor element as a comparison example. First, as shown in FIG. 18A, a first depressed portion 105a is formed in a first substrate 101. Next, after a protection film 107 is formed in at least one portion inside the first depressed portion 105a, as shown in FIG. 18B, a second depressed portion 106a is formed in a bottom portion of the first depressed portion 105a, as shown in FIG. 18C.

Figure 19A:
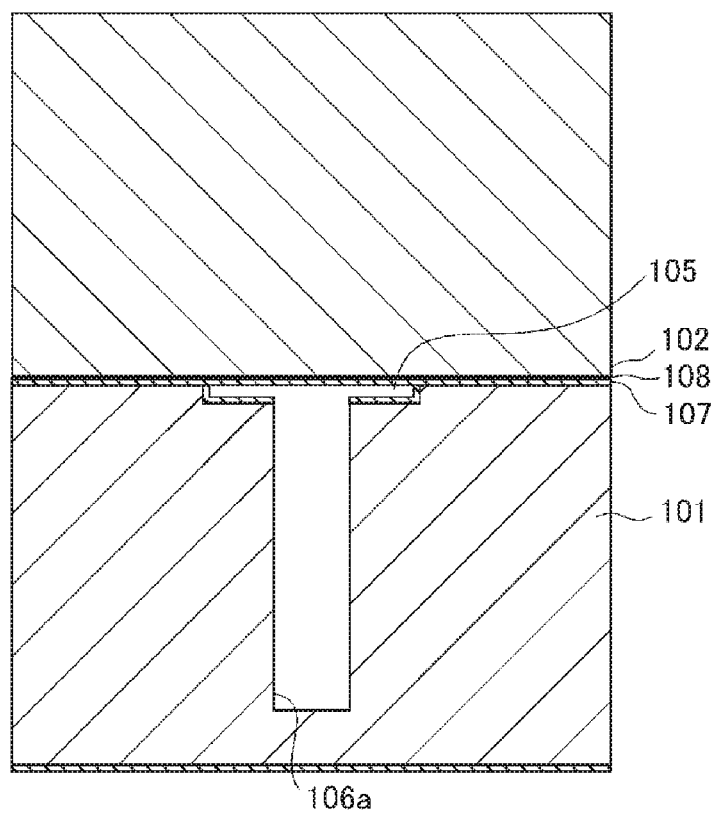
FIGS. 19A and 19B are sectional views showing a manufacturing method of a heretofore known semiconductor differential pressure sensor element which is a comparison example of the invention.
Figure 19B:
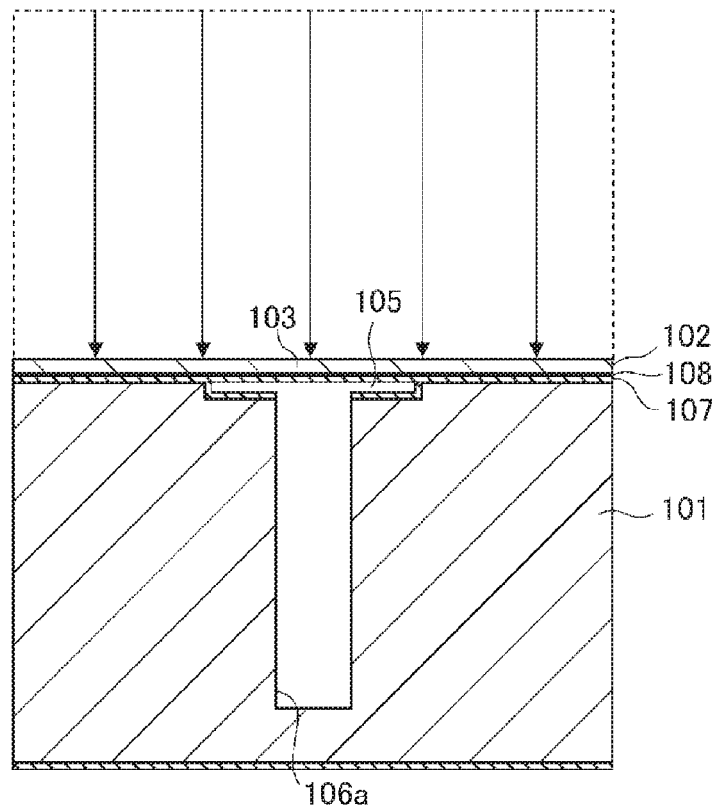
Figure 20A:
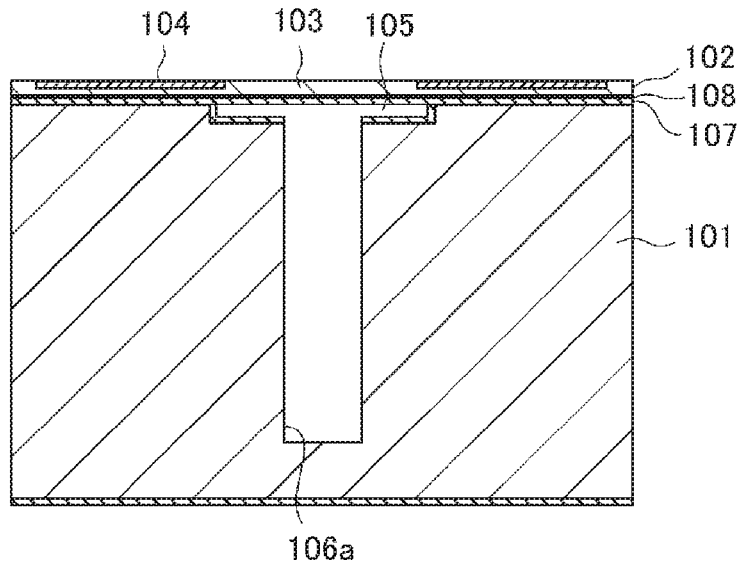
FIGS. 20A and 20B are sectional views showing a manufacturing method of a heretofore known semiconductor differential pressure sensor element which is a comparison example of the invention.
Figure 20B:
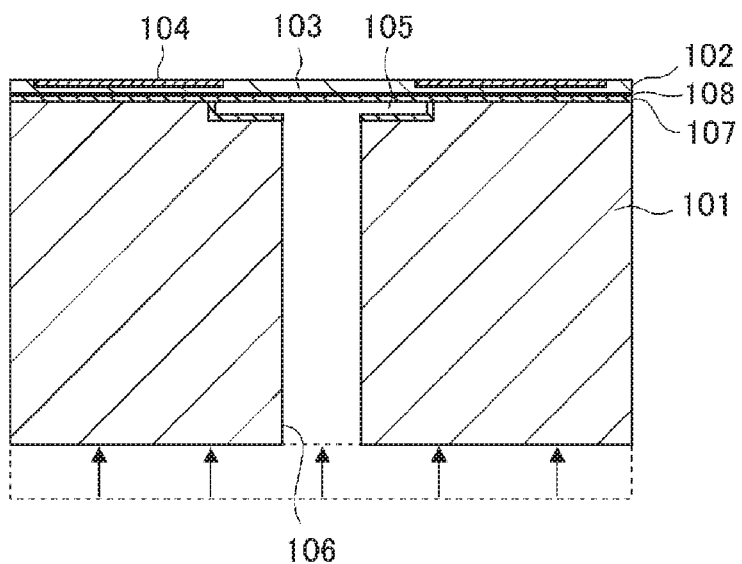

Subsequently, as shown in FIG. 19A, a second substrate 102 on which is formed a protection film 108 is bonded to a surface of the first substrate 101 in which is formed the first depressed portion 105a, thus forming a first void portion 105. Subsequently, as shown in FIG. 19B, the second substrate 102 is thinned to form a diaphragm 103. Subsequently, as shown in FIG. 20A, a strain sensitive element 104 and a conductive portion are formed in the diaphragm 103. Furthermore, as shown in FIG. 20B, the first substrate 101 is thinned from the outer surface side to form an opening portion connecting to the second depressed portion 106a, thus forming a second void portion 106.

Figure 3A:
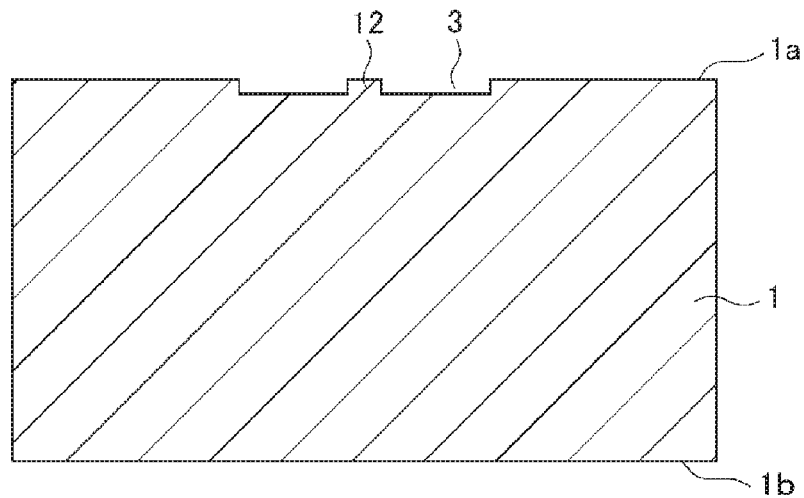
FIGS. 3A and 3B are sectional views showing a manufacturing method of the semiconductor differential pressure sensor element according to the first embodiment of the invention.

Next, a description will be given, using FIGS. 3A to 5C, of a manufacturing method of the semiconductor differential pressure sensor element 100 according to the first embodiment. First, as shown in FIG. 3A, a region of the one main surface 1a of the first semiconductor substrate 1 in which to form the depressed portion 3 is etched leaving one portion, thereby forming the depressed portion 3 having therein a sacrificial column 12 (depressed portion formation step). Specifically, portions of the first semiconductor substrate 1, other than the portion in which to form the depressed portion 3 (that is, including the portion in which to form the sacrificial column 12), are masked with a resist, or the like, and etched by a Bosch process, or the like, thus forming the depressed portion 3 and sacrificial column 12 at the same time.

The sacrificial column 12 is typically a square column, but may be around column. There is a certain degree of freedom for the number and layout of sacrificial columns 12, but the sacrificial column 12 is preferably disposed substantially in the central portion of the depressed portion 3. The sacrificial column 12 functions to hold the diaphragm 5 so as to prevent the diaphragm 5 from breaking in a diaphragm formation step and a functional element formation step, to be described hereafter. Consequently, it is important to design the sacrificial column 12 so as to prevent the resonance frequency of the diaphragm 5 held by the sacrificial column 12 from coming close to the frequency of each kind of external force in the diaphragm formation step and functional element formation step.

Figure 3B:
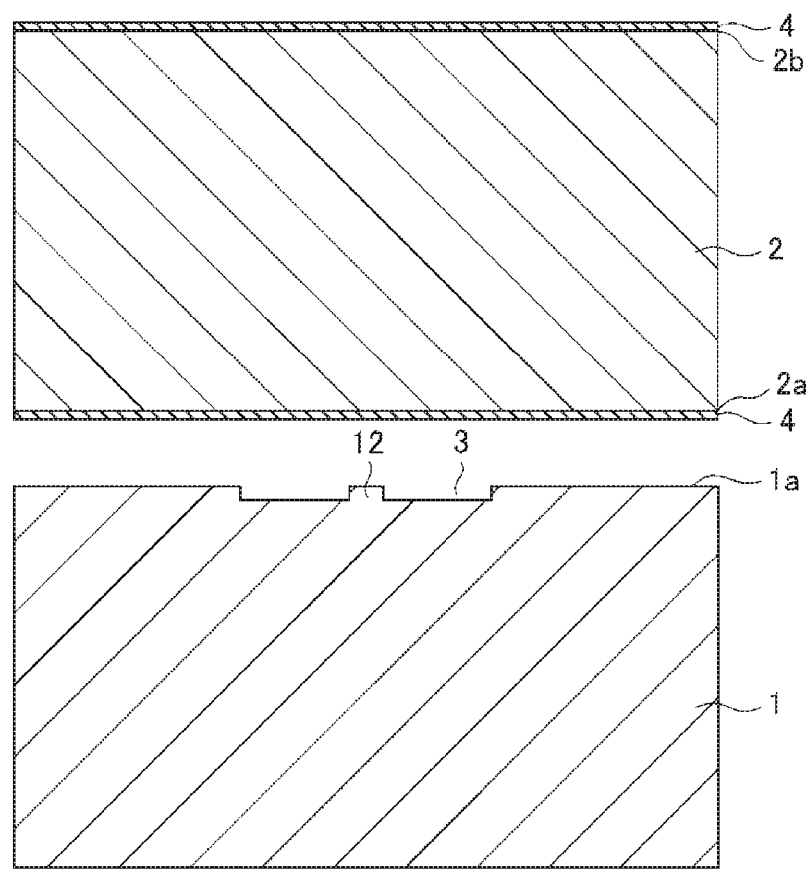
Figure 4A:
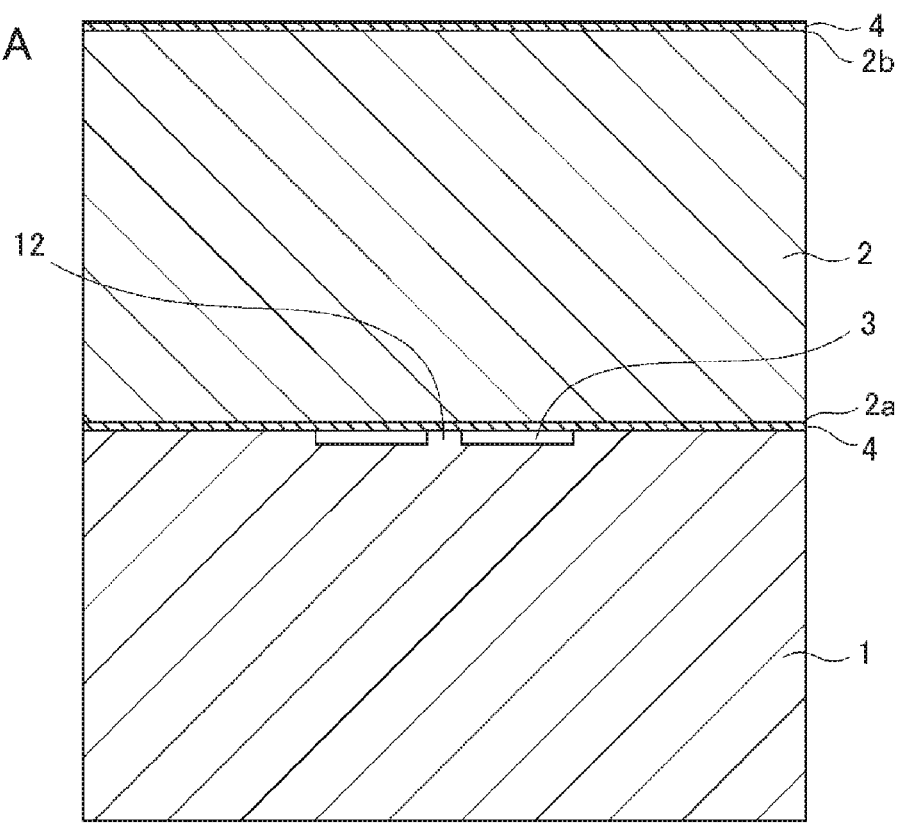
FIGS. 4A and 4B are sectional views showing a manufacturing method of the semiconductor differential pressure sensor element according to the first embodiment of the invention.

Subsequently, the second semiconductor substrate 2 having the oxide film 4 is prepared, as shown in FIG. 3B, and the one main surface 1a of the first semiconductor substrate 1, in which the depressed portion 3 and sacrificial column 12 are formed, and the one main surface 2a of the second semiconductor substrate 2 are bonded together, as shown in FIG. 4A (bonding step). Direct bonding which is established as an SOI wafer manufacturing technology is suitable for the bonding. That is, the well-cleaned first semiconductor substrate 1 and second semiconductor substrate 2, after being provisionally bonded together at room temperature, are heat-treated under an oxidizing atmosphere on the order of 1100° C., thereby obtaining a robust bonding strength.

Figure 4B:
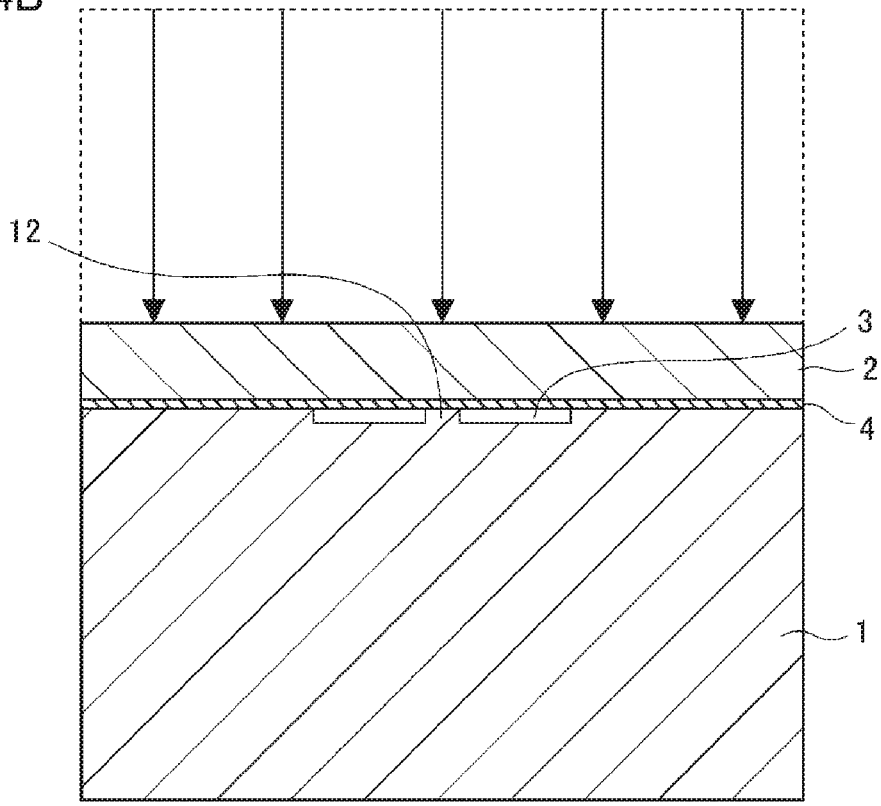
Figure 5A:
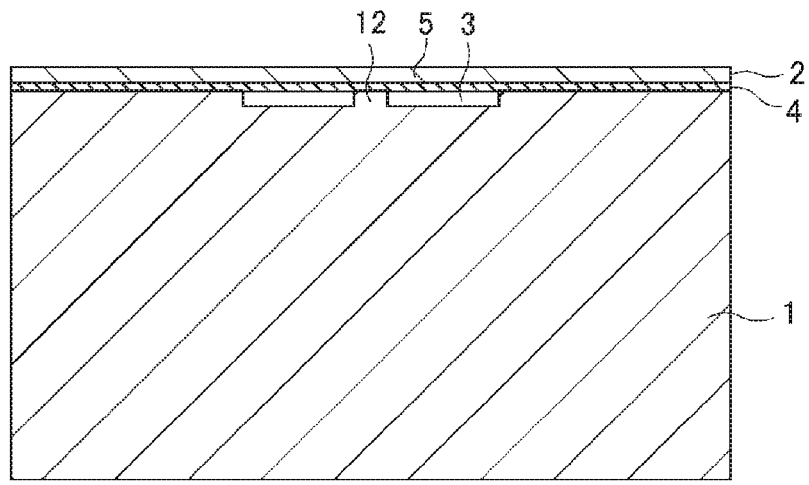
FIGS. 5A to 5C are sectional views showing a manufacturing method of the semiconductor differential pressure sensor element according to the first embodiment of the invention.

Subsequently, the second semiconductor substrate 2 is thinned from the other main surface 2b side, as shown in FIG. 4B, thus forming the diaphragm 5 having a predetermined thickness, as shown in FIG. 5A (diaphragm formation step). The thinning of the second semiconductor substrate 2 is carried out by being ground by a grinder, or the like, and further, polished. In the previously described comparison example, it is often the case that a very large external force acts on the diaphragm 103 in the step of thinning the second substrate 102 and thus forming the diaphragm 103 (refer to FIG. 19B), resulting in breakage, but in the manufacturing method according to the first embodiment, as the diaphragm 5 is held by the sacrificial column 12, breakage of the diaphragm 5 is suppressed when thinning.

Figure 5B:
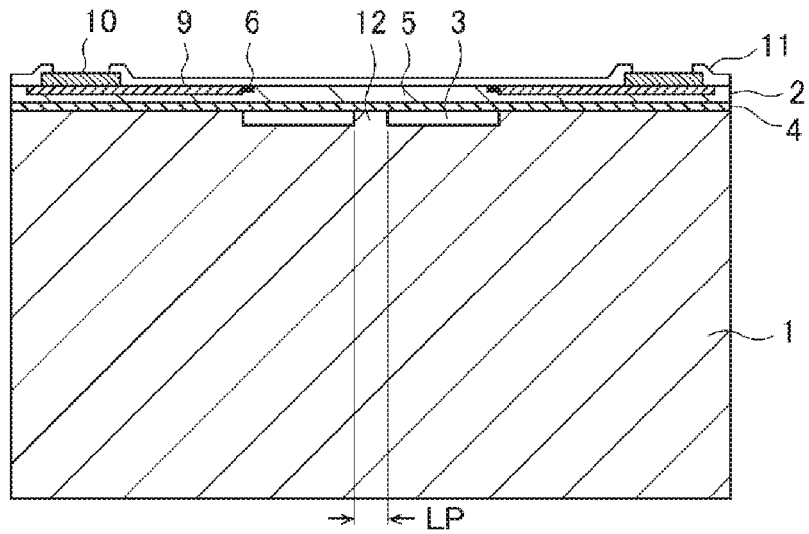

Subsequently, as shown in FIG. 5B, the strain sensitive elements 6 disposed inside the diaphragm 5, the electrodes 10 disposed in the outer frame portion 7 outside the diaphragm 5, and the diffusion wiring 9, which electrically connects the strain sensitive elements 6 and electrodes 10, are formed, and furthermore, a protection film 11 which protects these functional elements is formed, on the second semiconductor substrate 2 in which is formed the diaphragm 5 (functional element formation step). Each formation is performed by a semiconductor wafer process. The strain sensitive elements are, for example, piezoresistors, and are formed by implanting impurities, whose polarity is opposite to that of the impurity type of the second semiconductor substrate 2, by ion implantation or the like. The diffusion wiring 9 is also formed in the same way, but as it is used as a wire, is formed so as to have a lower resistance.

A cleaning step, such as ultrasonic cleaning, megasonic cleaning, brush scrub cleaning, or high pressure jet cleaning, is repeatedly carried out in the series of semiconductor wafer processes. In the previously described comparison example, there is the problem that as the repeated cleaning step often causes breakage of the diaphragm 5, and such wafers are discarded depending on the degree of breakage, the yield is very low. As opposed to this, in the manufacturing method according to the first embodiment, as the sacrificial column 12 holds the diaphragm 5, breakage of the diaphragm 5 is suppressed.

Figure 5C:
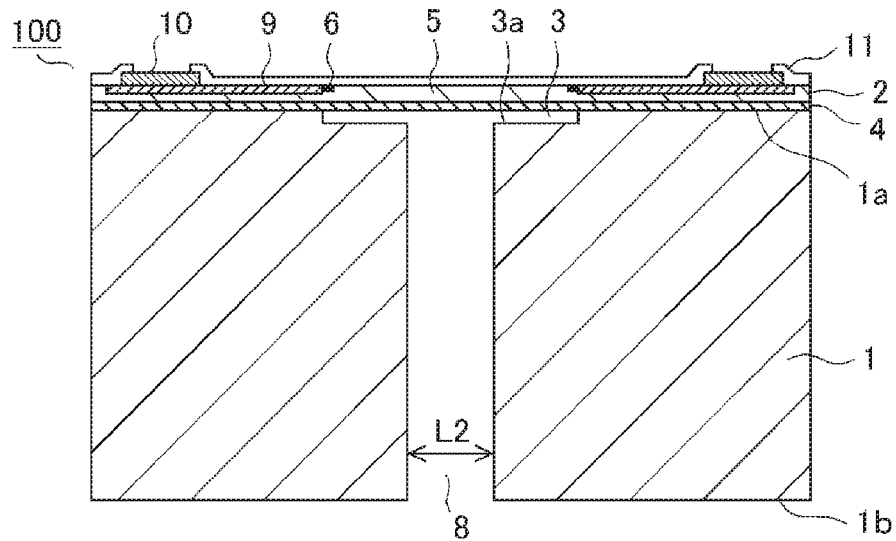

Finally, as shown in FIG. 5C, the first semiconductor substrate 1 is etched so as to pass through from the other main surface 1b to a bottom surface 3a of the depressed portion 3, thereby removing the sacrificial column 12 at the same time as forming the pressure lead hole 8 (pressure lead hole formation step). Etching using a Bosch process is used to form the pressure lead hole 8. In this step, as a width dimension L2 of the pressure lead hole 8 is designed to be larger than a width dimension Lp of the sacrificial column shown in FIG. 5B (L2>Lp), and the pressure lead hole 8 includes the sacrificial column 12, the sacrificial column 12 disappears at the same time as the pressure lead hole 8 is formed by the etching.

In the pressure lead formation step, as the oxide film 4 is formed on the main surface 2a of the second semiconductor substrate 2 even in the event that the etching for removing the sacrificial column 12 is over-etching, the oxide film 4 functions as an etching stopper, and the diaphragm 5 is not etched. The semiconductor differential pressure sensor element 100 according to the first embodiment is completed through the above steps.

Figure 6A:
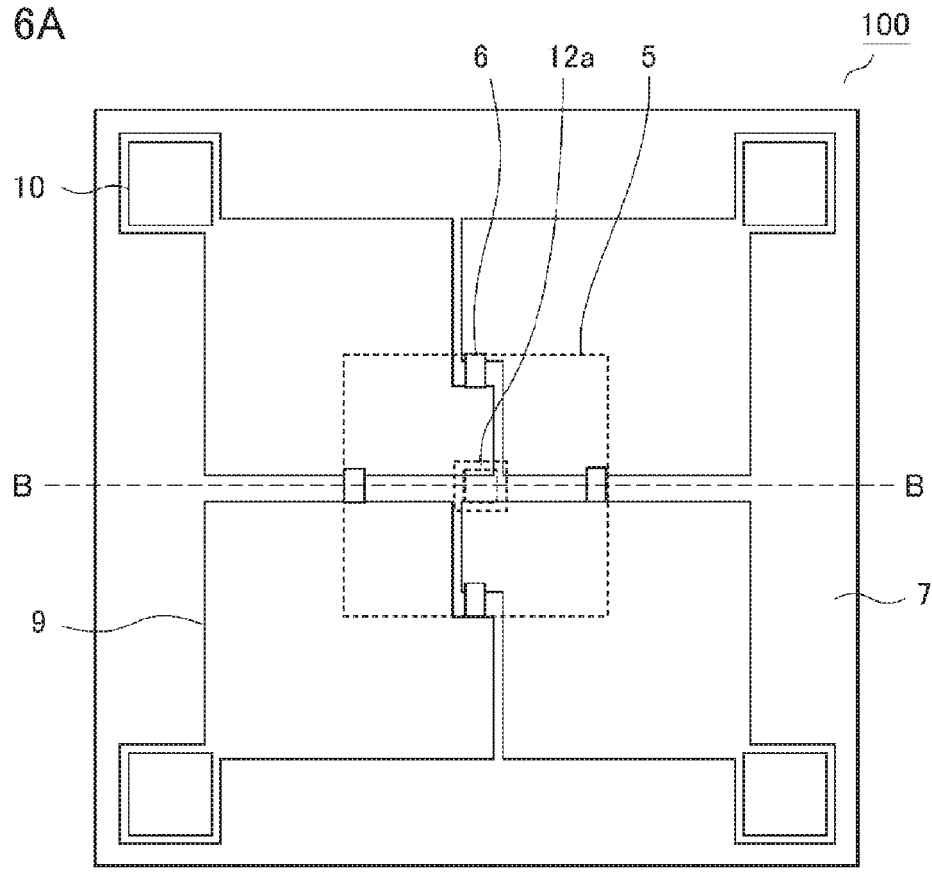
FIGS. 6A and 6B are a plan view and sectional view showing a modification example of a sacrificial column in a manufacturing method of the semiconductor differential pressure sensor element according to the first embodiment of the invention.
Figure 6B:
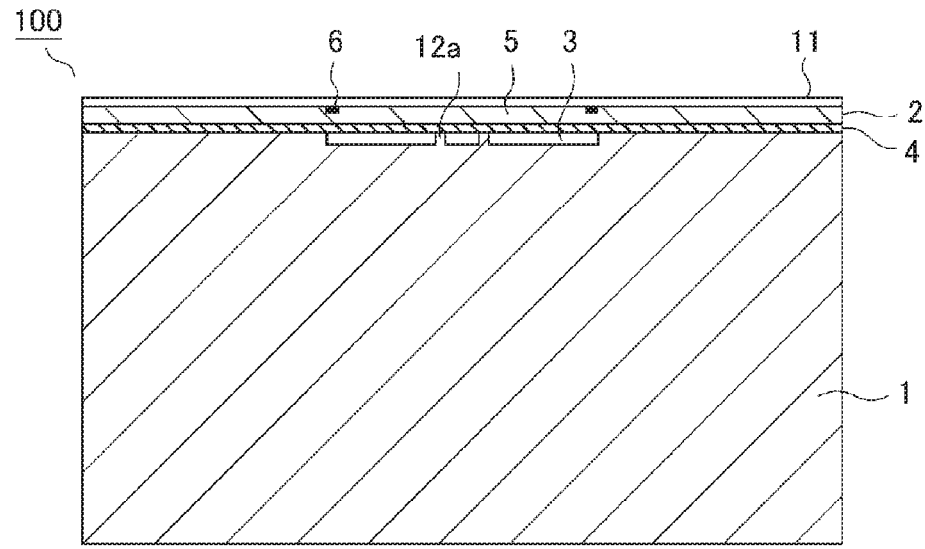

Also, FIG. 6A is a plan view showing a modification example of the sacrificial column in the semiconductor differential pressure sensor element manufacturing method according to the first embodiment, and FIG. 6B is a sectional view of the portion shown by B-B in FIG. 6A and shows the same manufacturing stage as in FIG. 5B, that is, a condition immediately before forming the pressure lead hole 8. In the modification example, a hollow structural sacrificial column 12a is provided as a sacrificial column which holds the diaphragm 5. The hollow structural sacrificial column 12a is easy to etch compared with the sacrificial column 12 which is a square column, and is efficiently removed.

As above, according to the first embodiment, as a configuration is such that the strain sensitive elements 6 are disposed only inside the diaphragm 5, and are electrically connected by the diffusion wiring 9 to the electrodes 10 disposed in the outer frame portion 7 outside the diaphragm 5, it is difficult for the thermal stress caused by expansion or contraction of the case 30 to propagate to the strain sensitive elements 6, thus obtaining a high precision semiconductor differential pressure sensor with less characteristic fluctuations resulting from a change in external temperature.

Also, according to the semiconductor differential pressure sensor manufacturing method according to the first embodiment, as a configuration is such that the sacrificial column 12, 12a is provided inside the depressed portion 3, and that the diaphragm 5 is held by the sacrificial column 12, 12a in the diaphragm formation step which thins the second semiconductor substrate 2 and in the functional element formation step which repeatedly implements the cleaning step in the semiconductor wafer processes, breakage of the diaphragm 5 can be prevented in the steps, thus achieving a significant improvement in yield.

Also, by forming the sacrificial column 12a into a hollow structure, the sacrificial column 12a can be more efficiently and reliably removed in the pressure lead formation step, thus achieving a further improvement in yield. As the sacrificial column 12, 12a can be formed at the same time as the formation of the depressed portion 3 and can be removed at the same time as the formation of the pressure lead hole 8, there is no increase in the number of steps in order to form and remove the sacrificial column 12, 12a, causing no increase in manufacturing cost.

Also, as a configuration is such that the pressure lead hole 8 is formed by etching the first semiconductor substrate 1 from the other main surface 1b side to the bottom surface 3a of the depressed portion 3, the high precision pressure lead hole 8 can be easily formed by inexpensive steps. With the pressure lead hole formation method of the comparison example, there are problems in the resist applicability when further extending the second depressed portion 106a in the bottom portion of the first depressed portion 105a, and in the photoengraving precision of the second depressed portion 106a, but no such problems exist in the pressure lead hole formation step according to the first embodiment.

Furthermore, in the semiconductor differential pressure sensor manufacturing method according to the first embodiment, as it is not necessary to grind or polish the first semiconductor substrate 1 after forming functional elements such as the diaphragm 5 and strain sensitive elements 6, the diaphragm 103 is not broken, or the strain sensitive element 104 or the like is not damaged, by grinding and polishing the surface substrate 101, as in the comparison example. Consequently, according to the first embodiment, it is possible to provide a semiconductor differential pressure sensor manufacturing method which is inexpensive and high in yield.

Second Embodiment

Figure 7A:
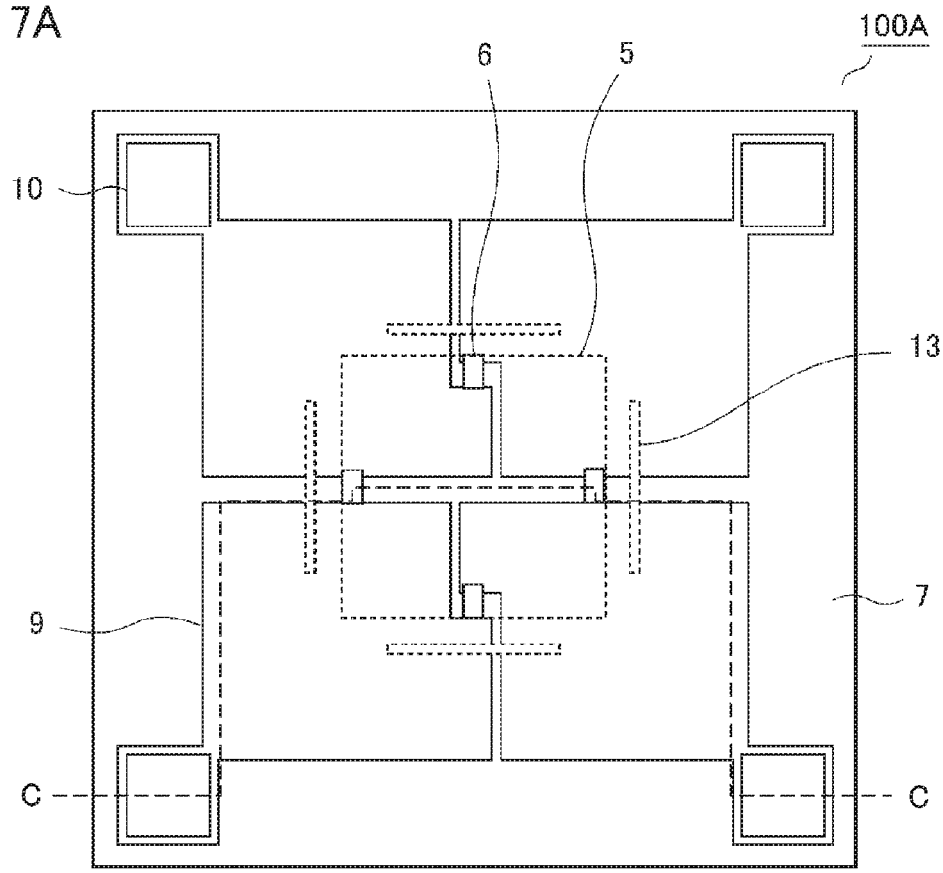
FIG. 7A and Mare a plan view and sectional view showing a semiconductor differential pressure sensor element according to a second embodiment of the invention.
Figure 7B:
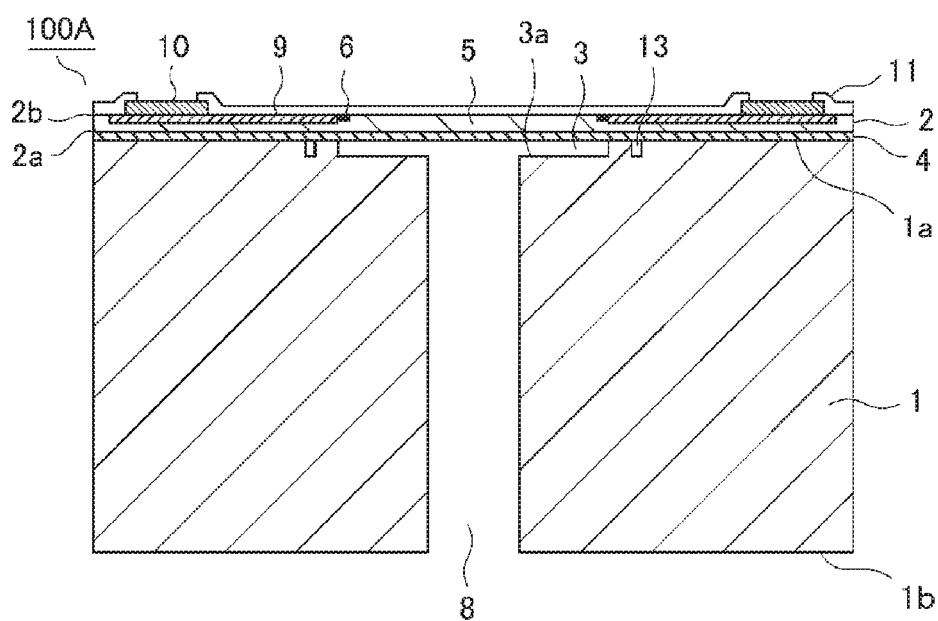

FIG. 7A is a plan view showing a semiconductor differential pressure sensor element according to a second embodiment of the invention, and FIG. 7B is a sectional view of the portion shown by C-C in FIG. 7A. As the assembly structure of a semiconductor differential pressure sensor according to the second embodiment is the same as in the first embodiment, FIG. 2 is used. A semiconductor differential pressure sensor element 100A according to the second embodiment has stress relaxation grooves 13 which are disposed, in the vicinity of the strain sensitive elements 6, along the shape of the diaphragm 5. As other configurations are the same as in the first embodiment, a description will be omitted.

The stress relaxation grooves 13 are provided around and along the depressed portion 3 of the one main surface 1a of the first semiconductor substrate 1. In this way, by providing the stress relaxation grooves 13 along the boundary of the diaphragm 5, the thermal stress caused by expansion or contraction of the case 30 can be effectively blocked from propagating to the strain sensitive elements 6.

Figure 8A:
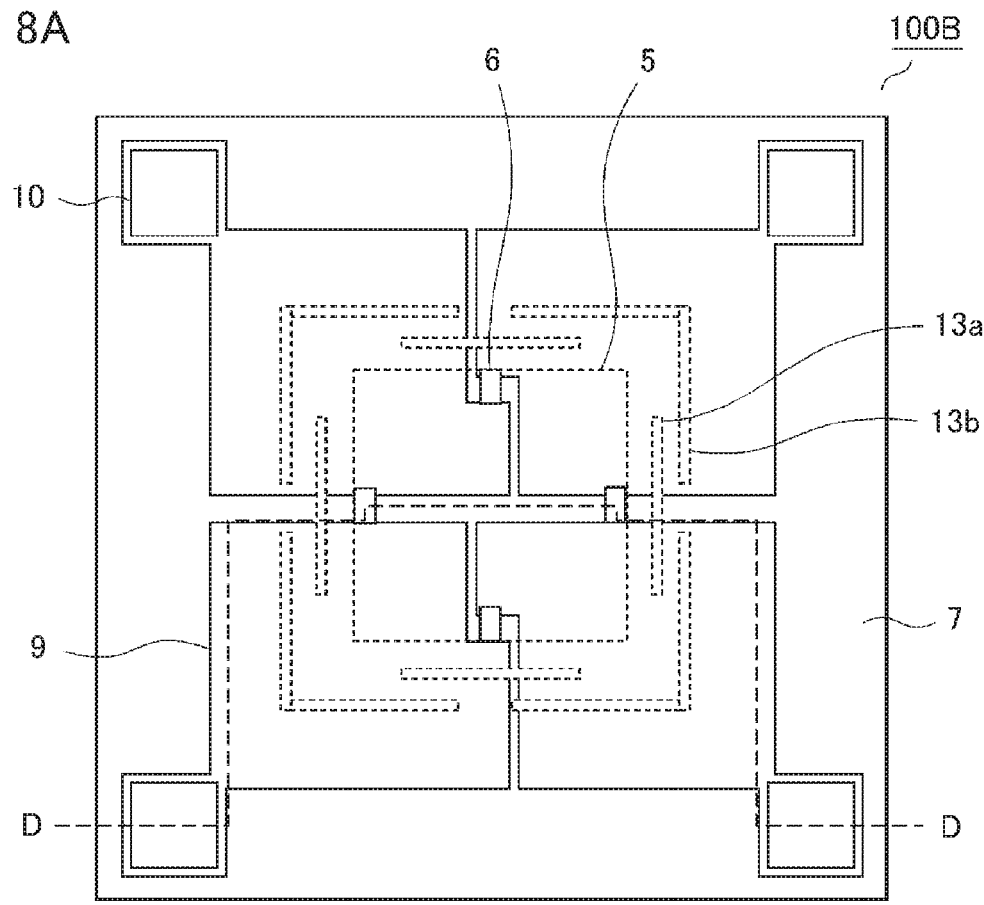
FIGS. 8A and 8B are a plan view and sectional view showing a modification example of the semiconductor differential pressure sensor element according to the second embodiment of the invention.
Figure 8B:
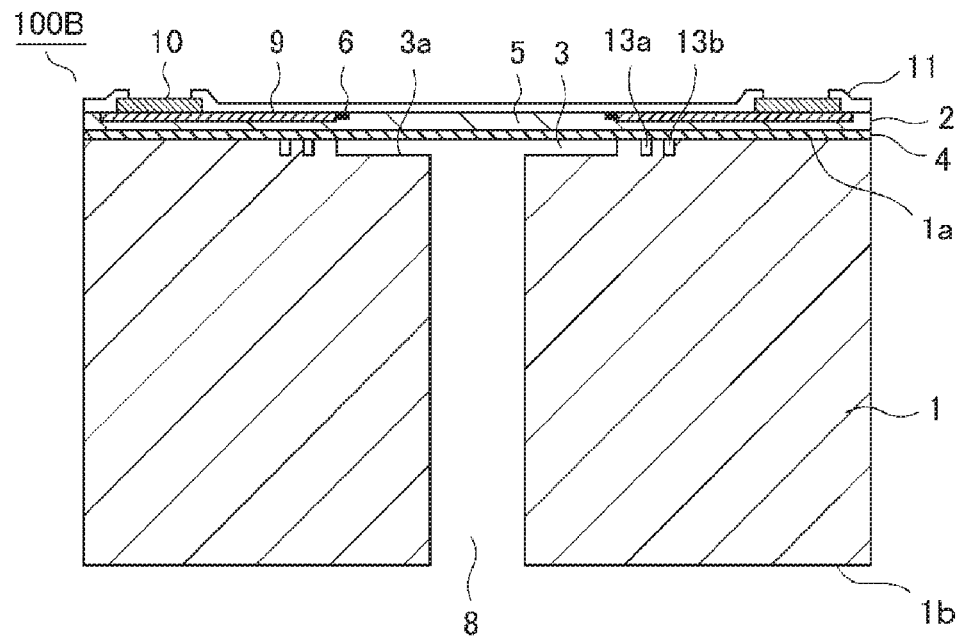

Also, FIG. 8A is a plan view showing a modification example of the semiconductor differential pressure sensor element according to the second embodiment, and FIG. 8B is a sectional view of the portion shown by D-D in FIG. 8A. A semiconductor differential pressure sensor element 100B which is a modification example of the second embodiment has, in the one main surface 1a of the first semiconductor substrate 1, stress relaxation grooves 13a and 13b of a nested structure in which the stress relaxation grooves 13a and 13b multiply surround the outer side of the depressed portion 3. By forming the stress relaxation grooves 13a and 13b into the multiply nested structure, a thermal stress blocking effect improves further.

It is preferable that the width dimension of the stress relaxation grooves 13, 13a, 13b is on the order of 10 μm. When the width dimension of the stress relaxation grooves 13, 13a, 13b is too large, there is the possibility that the stress relaxation grooves 13, 13a, 13b act like minute diaphragms, thus reducing measurement precision or impairing the bondability between the first semiconductor substrate 1 and the second semiconductor substrate 2. Also, the depth dimension of the stress relaxation grooves 13, 13a, 13b is basically the same as that of the depressed portion 3, but is not limited thereto. When the stress relaxation grooves 13, 13a, 13b and the depressed portion 3 are the same in depth dimension, it is efficient because the stress relaxation grooves 13, 13a, 13b and depressed portion 3 can be formed at the same time.

According to the second embodiment, in addition to the same advantages as in the first embodiment, by providing the stress relaxation grooves 13, 13a, 13b along the depressed portion 3, it is possible to more effectively block the thermal stress from the case 30, thus obtaining a very high precision semiconductor differential pressure sensor with much less characteristic fluctuations resulting from a change in external temperature. Also, as the stress relaxation grooves 13, 13a, 13b can be formed at the same time as the depressed portion 3, an improvement in measurement precision is achieved without involving any complication of manufacturing steps.

Third Embodiment

Figure 9:
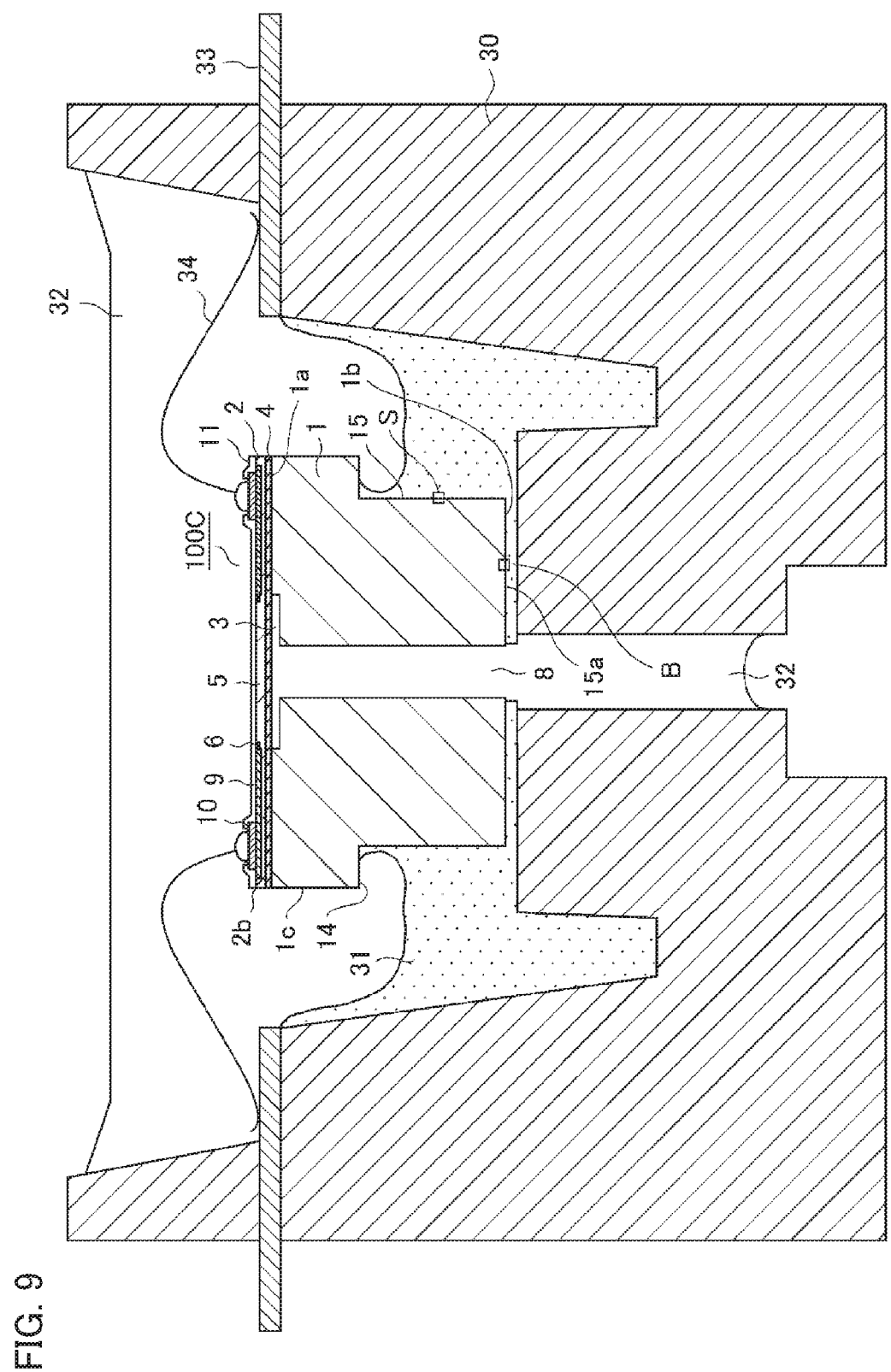
FIG. 9 is a sectional view showing an assembly structure of a semiconductor differential pressure sensor according to a third embodiment of the invention.

FIG. 9 shows an assembly structure of a semiconductor differential pressure sensor according to a third embodiment of the invention. A semiconductor differential pressure sensor element 100C according to the third embodiment, as well as having an overhanging portion 14, which is a stepped portion, on the side surface 1c of the first semiconductor substrate 1, has minute trough-crest shaped regions 15 and 15a on the side surface 1c and main surface 1b. As other configurations are the same as in the first embodiment, a description will be omitted.

In a semiconductor differential pressure sensor, in order to ensure the hermetic separation between the front and rear thereof, a die bond material is thickly applied to not only the rear surface, but also the side surface, of a semiconductor differential pressure sensor element. Because of this, in a heretofore known semiconductor differential pressure sensor manufacturing method, there is the problem that variation occurs in the quantity and position of application of the die bond material, and the die bond material creeps up even onto an electrode on the front surface side of the semiconductor differential pressure sensor element due to surface tension or the like, thus significantly reducing wire bond reliability.

Furthermore, there is the problem that although the semiconductor differential pressure sensor element does not separate from the case, one portion of the interface between the rear surface and side surface of the semiconductor differential pressure sensor element and the die bond material separates, and forms a minute leak path communicating with the external, thus making it impossible to maintain the hermetic separation between the front and rear of the semiconductor differential pressure sensor element. For the purpose of detecting filter clogging, this kind of hermetic separation defect is a fatal defect such that the event of filter clogging cannot be detected at all, and is more serious than a decrease in measurement precision.

The semiconductor differential pressure sensor element 100C according to the third embodiment is to solve the heretofore described kinds of problems, and as a unit for this purpose, includes the overhanging portion 14, which is a stepped portion, on the side surface 1c which connects the main surfaces 1a and 1b of the first semiconductor substrate 1. Because of this, the first semiconductor substrate 1 is such that the area of the main surface 1a thereof bonded to the second semiconductor substrate 2 is larger than the area of the rear side main surface 1b. By adopting this kind of structure, the semiconductor differential pressure sensor element 100C is such that the creeping up of the die bond material 31 can be suppressed by the overhanging portion 14 even when the die bond material 31 is thickly applied to the rear side main surface 1b and side surface 1c of the first semiconductor substrate 1, and it is thus possible to improve the reliability of wire bonding.

Figure 10:
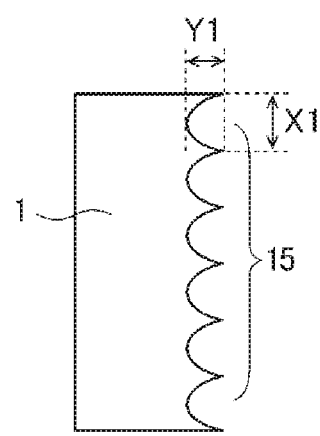
FIG. 10 is a partial enlarged sectional view showing a side surface of a first semiconductor substrate of a semiconductor differential pressure sensor element according to the third embodiment of the invention.
Figure 11:
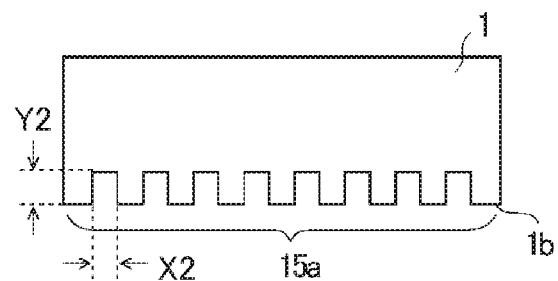
FIG. 11 is a partial enlarged sectional view showing a main surface on the rear side of the first semiconductor substrate of the semiconductor differential pressure sensor element according to the third embodiment of the invention.

Furthermore, as another unit for suppressing the creeping up of the die bond material 31, it is effective to provide minute trough-crest shaped regions, such as shown in FIGS. 10 and 11, in portions of the semiconductor differential pressure sensor element 100C in contact with the die bond material 31. FIG. 10 is a partial enlarged sectional view of the portion shown by S in FIG. 9, and FIG. 11 is a partial enlarged sectional view of the portion shown by B in FIG. 9.

A minute trough-crest shaped region 15 shown in FIG. 10 is provided in a portion, on the rear surface side of the overhanging portion 14, of the side surface 1c which connects the one main surface 1a, and the other main surface 1b, of the first semiconductor substrate 1. A width dimension X1 and depth dimension Y1 of the minute trough-crest shaped region 15 are both typically on the order of 1 μm to 5 μm.

Also, a minute trough-crest shaped region 15a shown in FIG. 11 is provided on the main surface 1b of the first semiconductor substrate 1 which is the rear surface of the semiconductor differential pressure sensor element 100C. A width dimension X2 and depth dimension Y2 of the troughs of the minute trough-crest shaped region 15a are both typically on the order of 1 μm to 5 μm, and the width dimension of the crests is also on the order of 1 μm to 5 μm. The minute trough-crest shaped region 15a provided on the rear surface of the semiconductor differential pressure sensor element 100C can be designed with a higher degree of freedom than the minute trough-crest shaped region 15 provided on the side surface.

The semiconductor differential pressure sensor element 100C according to the third embodiment may include any one of the overhanging portion 14, the minute trough-crest shaped region 15 on the side surface, or the minute trough-crest shaped region 15a on the rear surface. However, by including all of them, a high synergistic effect is obtained. Also, in each of the semiconductor differential pressure sensor elements 100, 100A, and 100B according to the first embodiment and second embodiment, which has no overhanging portion 14, the minute trough-crest shaped regions 15 and 15a may be provided on the side surface 1c, and the main surface 1b on the rear surface side, of the first semiconductor substrate 1.

A description will be given, using FIGS. 12A to 13B, of a manufacturing method of the semiconductor differential pressure sensor element 100C according to the third embodiment. Herein, only a pressure lead hole formation step will be described, and as a bonding step, a diaphragm formation step, and a functional element formation step are the same as in the first embodiment, a description will be omitted.

Figure 12A:
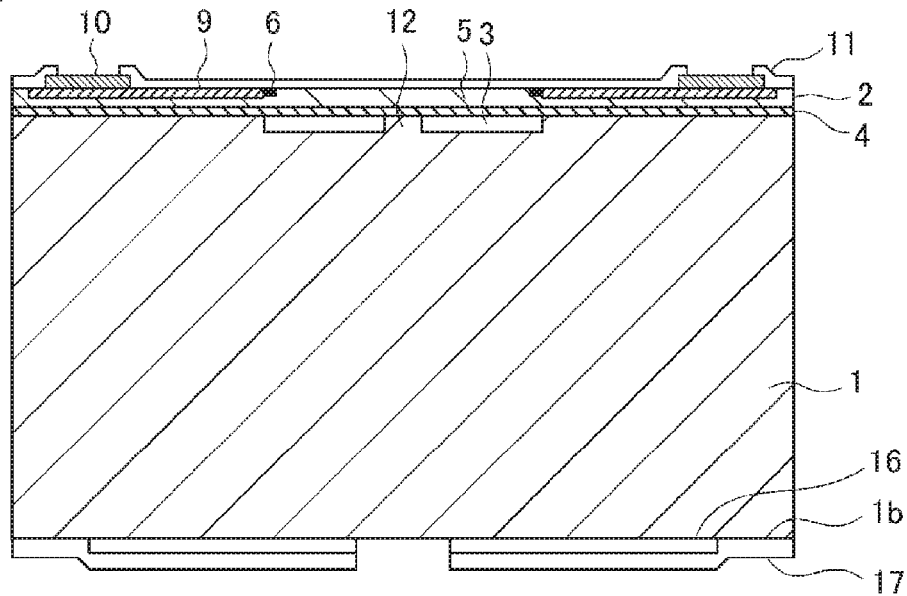
FIGS. 12A and 12B are sectional views showing a manufacturing method of the semiconductor differential pressure sensor element according to the third embodiment of the invention.

In the third embodiment, in the pressure lead hole formation step, as shown in FIG. 12A, a first protection film 16 is formed on the main surface 1b on the rear surface side of the first semiconductor substrate 1, and regions of the first protection film 16 in which to form the pressure lead hole 8 later and in which to form the overhanging portion 14 later are removed and opened. Subsequently, a second protection film 17 is formed on the first protection film 16 of the first semiconductor substrate 1, and a region of the second protection film 17 in which to form the pressure lead hole 8 is removed and opened. Films different in material are used, for example, an oxide film is used as the first protection film 16, and for example, a nitride film is used as the second protection film 17.

Figure 12B:
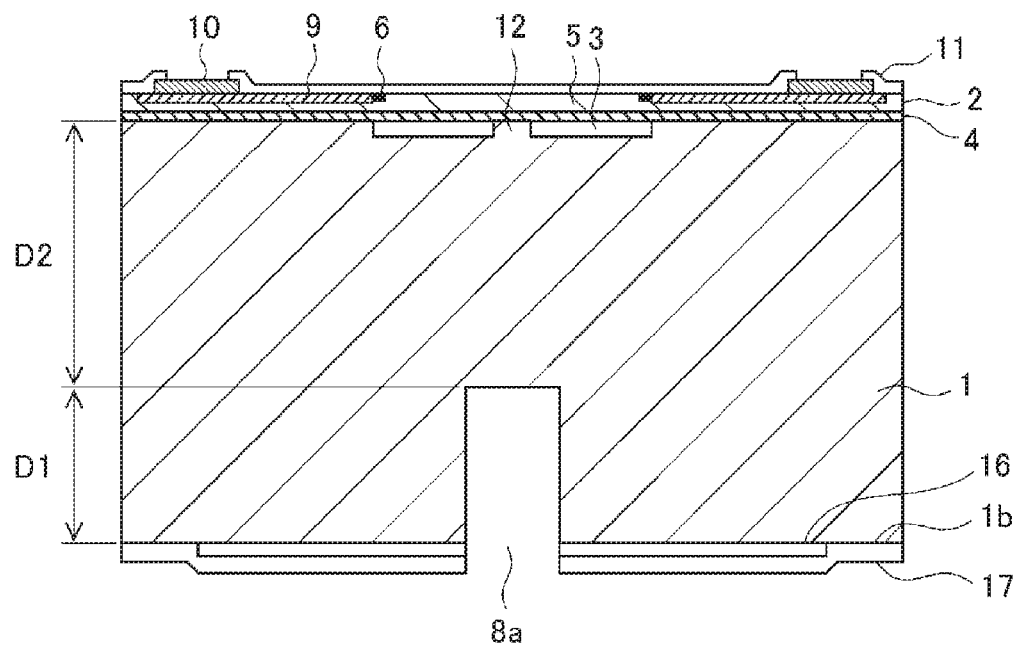
Figure 13A:
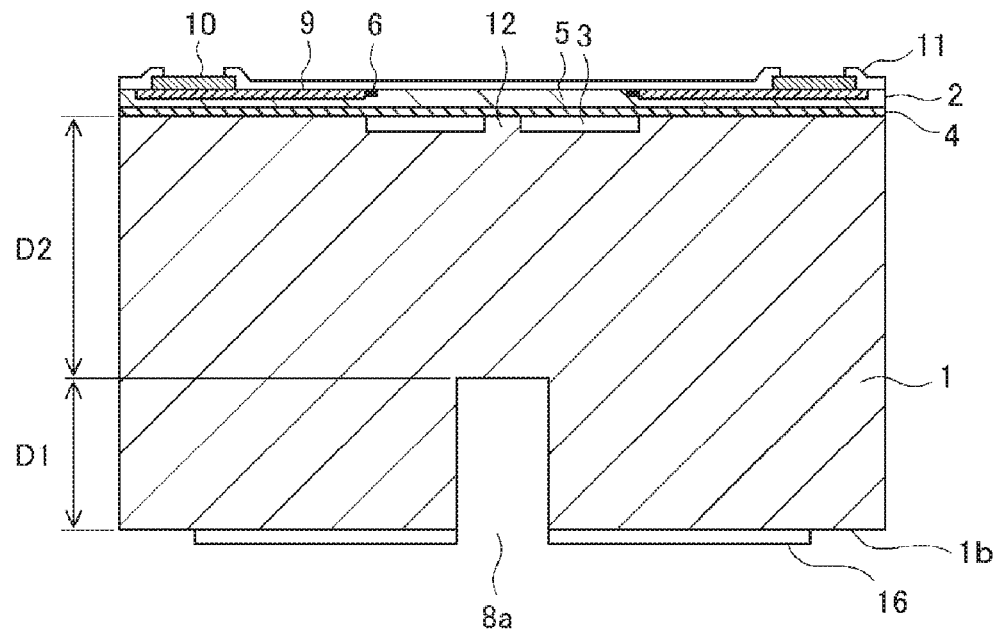
FIGS. 13A and 13B are sectional views showing a manufacturing method of the semiconductor differential pressure sensor element according to the third embodiment of the invention.

Next, as shown in FIG. 12B, the first semiconductor substrate 1 on which are formed the first protection film 16 and second protection film 17 is etched by a predetermined depth D1 from the main surface 1b side, thus forming a first depressed portion 8a of the depth D1 in a region in which to form the pressure lead hole 8. When using an eight-inch wafer, D1 is, for example, on the order of 100 μm to 200 μm. As the etching, typically, DRIE (Deep Reactive Ion Etching) using a Bosch process is used. Subsequently, as shown in FIG. 13A, only the second protection film 17 is removed utilizing material selectivity, thus exposing the first protection film 16 and opening portions of the first protection film 16 in which to form the pressure lead hole 8 and overhanging portion 14 later.

Figure 13B:
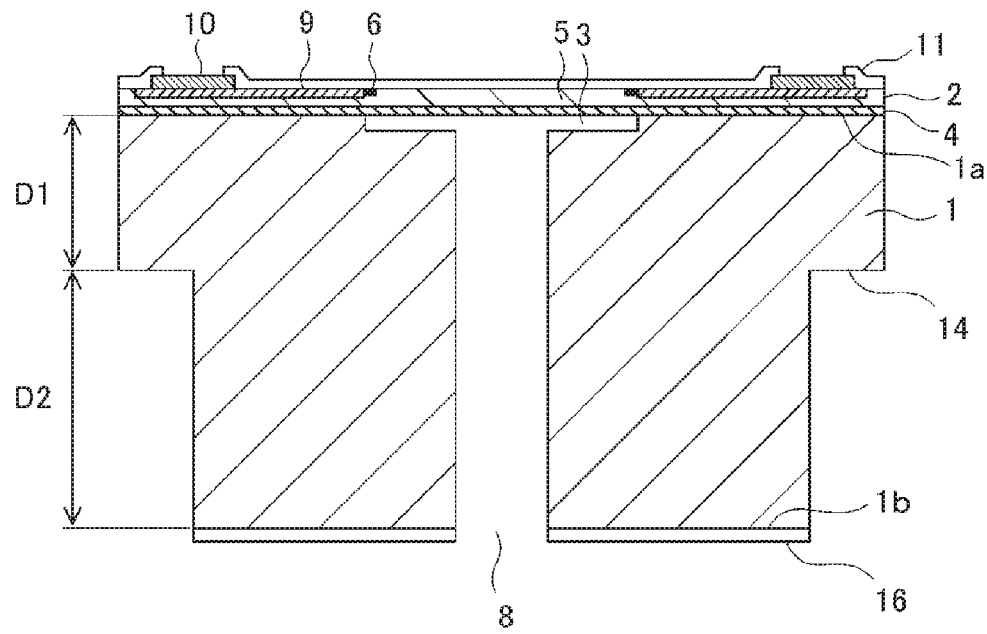

Next, as shown in FIG. 13B, the first semiconductor substrate 1 on which is formed the first protection film 16 is etched by a depth D2 from the main surface 1b side by DRIE using a Bosch process. D2 is the difference between the thickness and D1 of the first semiconductor substrate 1, and the sum of D1 and D2 is equal to the thickness of the first semiconductor substrate 1. In the case of an eight-inch wafer, D2 is, for example, on the order of 500 μm to 600 μm. By the etching, the sacrificial column 12 is removed at the same time as forming the overhanging portion 14, which is positioned on the side surface of the first semiconductor substrate 1 at a distance D1 away from the one main surface 1a, and the pressure lead hole 8.

Subsequently, as necessary, regular minute trough-crest shaped regions 15 and 15a are formed on the side surface 1c and main surface 1b of the first semiconductor substrate 1. The minute trough-crest shaped regions 15 and 15a can be formed into a micro-scallop structure by, for example, etching using a Bosch process. As the Bosch process is such that the depth and size of the troughs and crests can be adjusted by adjusting an etching recipe, the Bosch process is suitable for forming the minute trough-crest shaped regions 15 and 15a. The semiconductor differential pressure sensor element 100C according to the third embodiment is completed through the above steps.

According to the third embodiment, in addition to the same advantages as in the first embodiment, by including the overhanging portion 14 on the side surface of the semiconductor differential pressure sensor element 100C, the creeping up of the die bond material 31 can be suppressed. Because of this, as the bonding surfaces of the electrodes 10 positioned in the outer frame portion 7 on the front surface side of the semiconductor differential pressure sensor element 100C are kept clean, wire bonding reliability can be improved. Also, by providing the overhanging portion 14, it is easy to control the quantity and position of application of the die bond material 31, and the hermetic separation between the front and rear of the semiconductor differential pressure sensor can be reliably carried out.

Also, as the area of contact with and the distance of interface with the die bond material 31 can be dramatically increased by providing the minute trough-crest shaped regions 15 and 15a in the portions of the semiconductor differential pressure sensor element 100C in contact with the die bond material 31, the creeping up of the die bond material 31 can be further suppressed, and the possibility of the leak path connecting to the external can be significantly reduced, thus achieving an improvement in hermetic reliability.

Also, as the minute trough-crest shaped regions 15 and 15a bite hard into the die bond material 31, the force with which the die bond material 31 holds the semiconductor differential pressure sensor element 100C improves remarkably. Consequently, it is difficult for the semiconductor differential pressure sensor element 100C to separate from the case 30, and a high precision measurement can be carried out even in an environment with a large pressure difference.

Fourth Embodiment

Figure 14:
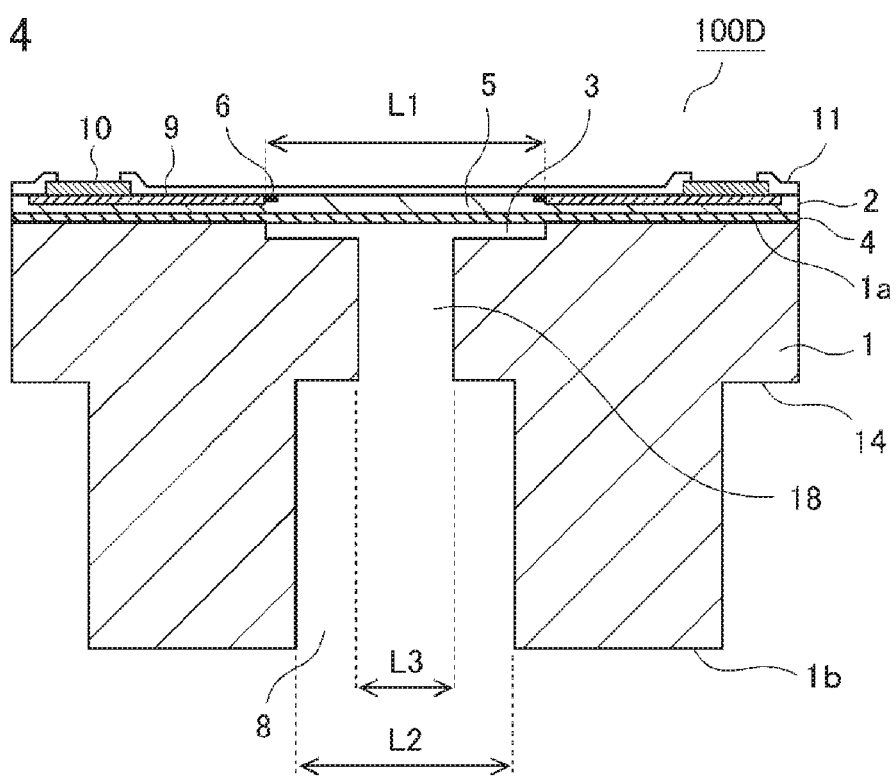
FIG. 14 is a sectional view showing a semiconductor differential pressure sensor element according to a fourth embodiment of the invention.

FIG. 14 shows a semiconductor differential pressure sensor element according to a fourth embodiment of the invention. As the assembly structure of a semiconductor differential pressure sensor according to the fourth embodiment is the same as in the third embodiment, FIG. 9 is used. A semiconductor differential pressure sensor element 100D according to the fourth embodiment, having a communication hole 18 between the pressure lead hole 8 and the depressed portion 3, is configured so as to prevent the die bond material 31 from occluding the pressure lead hole 8 by making the opening cross-sectional area of the pressure lead hole 8 larger than the cross-sectional area of the communication hole 18. As other configurations are the same as in the third embodiment, a description will be omitted.

As shown in FIG. 14, the first semiconductor substrate 1 configuring the semiconductor differential pressure sensor element 100D is formed so that an opening width L2 of the pressure lead hole 8 on the side communicating with the external is larger than an opening width L3 of the communication hole 18 communicating with the depressed portion 3 which defines the outline of the diaphragm 5. In this way, the structure having the communication hole 18 between the pressure lead hole 8 and the depressed portion 3 can be formed at the same time by etching the first semiconductor substrate 1 when forming the overhanging portion 14.

As a problem of the heretofore known semiconductor differential pressure sensor, there is the problem that the die bond material for holding the semiconductor differential pressure sensor element to the case runs over into the pressure lead hole and, in the worst case, occludes the pressure lead hole, thus making it impossible to measure a desired pressure. As opposed to this, the semiconductor differential pressure sensor according to the fourth embodiment is such that as the opening cross-sectional area of the pressure lead hole 8 is made large by providing the communication hole 18 between the pressure lead hole 8 and the depressed portion 3, it is difficult for the pressure lead hole 8 to be occluded by the die bond material 31 even when there is a large quantity of application of the die bond material 31 or when variation occurs in the position of application.

According to the fourth embodiment, in addition to the same advantages as in the third embodiment, by making the opening cross-sectional area of the pressure lead hole 8 larger than in the third embodiment, it is possible to drastically reduce the risk of the pressure lead hole 8 being occluded by the die bond material 31, thus obtaining a more highly reliable semiconductor differential pressure sensor.

Fifth Embodiment

Figure 15:
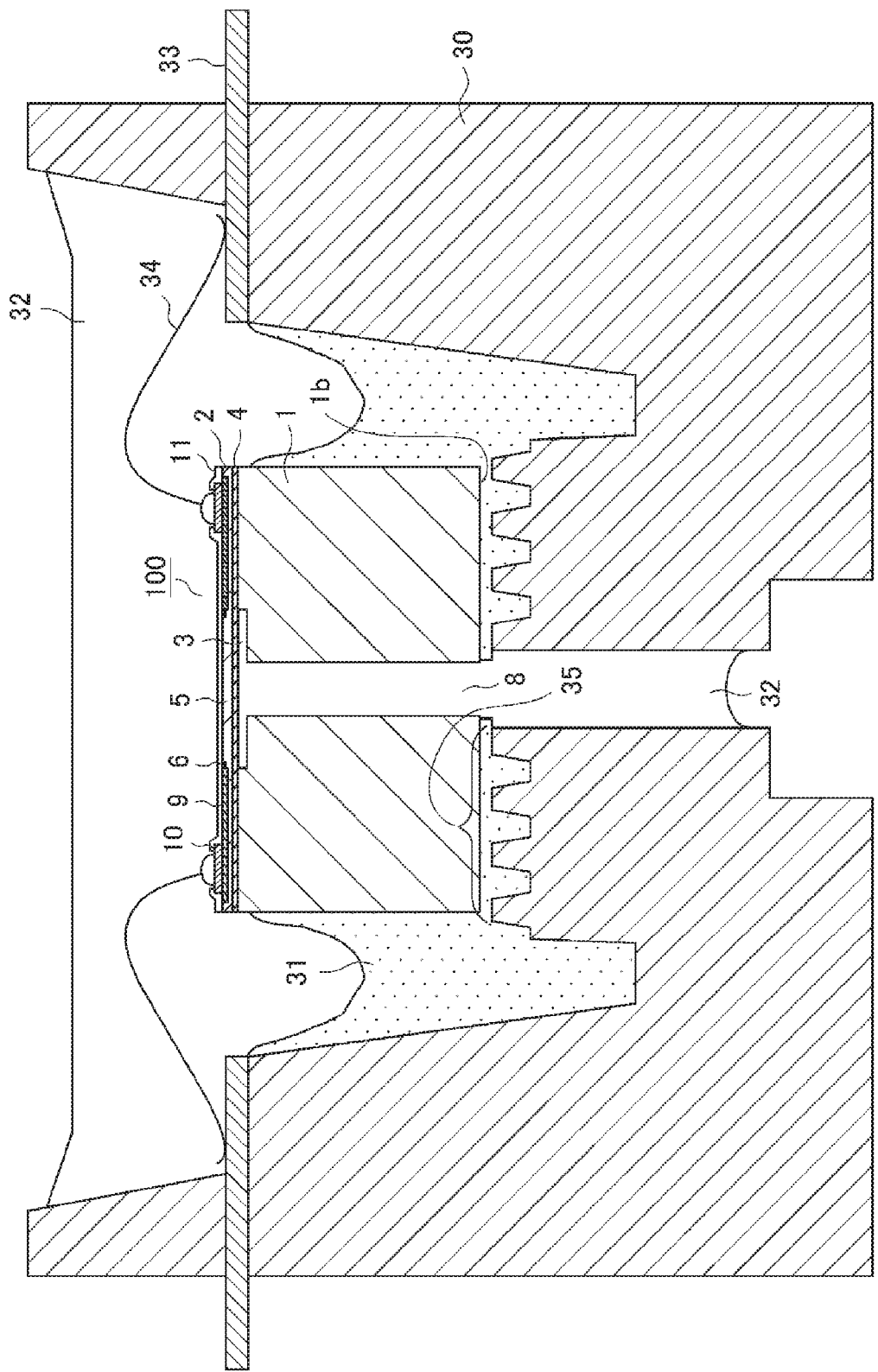
FIG. 15 is a sectional view showing an assembly structure of a semiconductor differential pressure sensor according to a fifth embodiment of the invention.

FIG. 15 shows an assembly structure of a semiconductor differential pressure sensor according to a fifth embodiment of the invention. As a semiconductor differential pressure sensor element 100 according to the fifth embodiment is the same as in the first embodiment, a description will be omitted. The semiconductor differential pressure sensor according to the fifth embodiment has a plurality of grooves 35 in a portion, to be bonded to the first semiconductor substrate 1, of the case 30 in which is mounted the semiconductor differential pressure sensor element 100.

In the heretofore known semiconductor differential pressure sensor, there is the problem that one portion of the interface between the die bond material and the case separates, and that the leak path is formed in the portion. In order to solve this kind of problem, the case 30 of the semiconductor differential pressure sensor according to the fifth embodiment has the plurality of grooves 35 in a portion of the case 30 to be bonded to the main surface 1b on the rear surface side of the first semiconductor substrate 1. By providing the grooves 35, the area of contact of the die bond material 31 with the case 30 increases significantly, causing the die bond material 31 to bite into the case 30, and the semiconductor differential pressure sensor element 100 is rigidly held to the case 30.

Also, as the distance of interface between the case 30 and the die bond material 31 increases significantly, it is difficult for the leak path to occur. Furthermore, as the thermal stress caused by expansion or contraction of the case 30 is absorbed by the grooves 35, characteristic fluctuations resulting from a change in external temperature are suppressed, thus obtaining a stable and high measurement precision.

According to the fifth embodiment, in addition to the same advantages as in the first embodiment, by having the plurality of grooves 35 in the portion of the case 30 to be bonded to the first semiconductor substrate 1, an improvement in hermetic reliability and measurement precision is achieved.

Sixth Embodiment

Figure 16A:
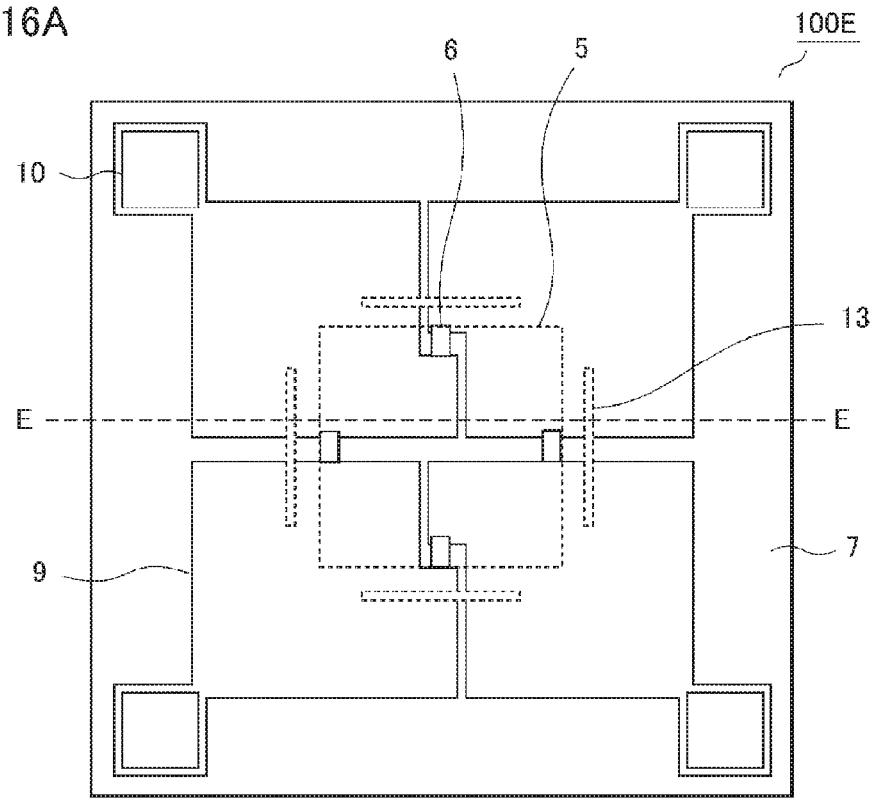
FIGS. 16A and 16B are a plan view and sectional view showing a semiconductor differential pressure sensor element according to a sixth embodiment of the invention.
Figure 16B:
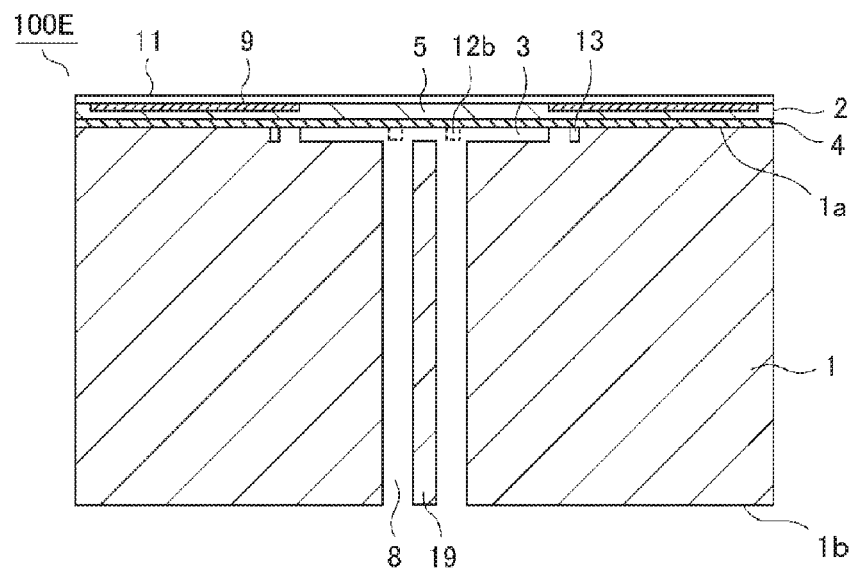

FIG. 16A is a plan view showing a semiconductor differential pressure sensor element according to a sixth embodiment of the invention, FIG. 16B is a sectional view of the portion shown by E-E in FIG. 16A, and FIG. 17 is a bottom view showing the semiconductor differential pressure sensor element according to the sixth embodiment. In FIGS. 16B and 17, sacrificial columns 12b to be formed and removed in a manufacturing process are shown by the broken line.

In order to detect a minute pressure difference in a semiconductor differential pressure sensor, it is preferable to set the rigidity of a diaphragm to be low, and the diaphragm is inevitably thin and large. Because of this, the heretofore known semiconductor differential pressure sensor has the problem that when an excessive pressure difference is suddenly applied, the diaphragm undergoes a considerably large deflection, resulting in breakage. In order to solve this kind of problem, a semiconductor differential pressure sensor element 100E according to the sixth embodiment has a stopper 19 which suppresses a displacement of the diaphragm 5.

The stopper 19 is held, from four sides by support beams 20, inside the pressure lead hole 8 of the first semiconductor substrate 1, as shown in FIG. 17. As the stopper 19 suppresses a displacement of the diaphragm 5 when the deflection of the diaphragm 5 is very large due to a sudden application of an excessive pressure difference to the semiconductor differential pressure sensor element 100E, it is effective that the stopper 19 is disposed so as to be opposite to a central portion in which the amount of displacement of the diaphragm 5 is largest.

The stopper 19 and support beams 20 are formed by being masked so as to prevent portions corresponding to the stopper 19 and support beams 20 from being etched in the pressure lead hole formation step. In the first embodiment, the sacrificial column 12 is disposed in the central portion of the diaphragm (FIG. 5A), but in the fifth embodiment, the sacrificial columns 12b are disposed in four places avoiding the stopper 19 and support beams 20. As the pressure lead hole 8 includes the sacrificial columns 12b, the sacrificial columns 12b disappear by etching for forming the pressure lead hole 8.

According to the sixth embodiment, in addition to the same advantages as in the first embodiment, by having the stopper 19, which suppresses a displacement of the diaphragm 5, inside the pressure lead hole 8, it is possible to suppress breakage of the diaphragm 5 even in an environment with a large pressure difference, thus obtaining a more highly reliable semiconductor differential pressure sensor. In the invention, it is possible to freely combine the embodiments, or appropriately modify or omit any one of the embodiments, within the scope of the invention.

Various modifications and alterations of this invention will be apparent to those skilled in the art without departing from the scope and spirit of this invention, and it should be understood that this is not limited to the illustrative embodiments set forth herein.

What is claimed is:

1. A semiconductor differential pressure sensor, comprising:
   a semiconductor differential pressure sensor element comprising a first semiconductor substrate and a second semiconductor substrate, wherein,
   a first main surface of the first semiconductor substrate and a first main surface of the second semiconductor substrate are bonded together via an oxide film formed on the second semiconductor substrate,
   the first semiconductor substrate comprises a depressed portion provided in the first main surface of the first semiconductor substrate and a pressure lead hole which allows the depressed portion to communicate with an external device on a side of a second main surface of the first semiconductor substrate, and
   the second semiconductor substrate comprises a diaphragm defined by an outline of the depressed portion and disposed directly on the oxide film, strain sensitive elements disposed on a second main surface of the second semiconductor substrate and inside the diaphragm, electrodes disposed in a frame portion outside the diaphragm, and diffusion wiring which electrically connects the strain sensitive elements and the electrodes.

2. The semiconductor differential pressure sensor according to claim 1, wherein
   the first semiconductor substrate has a stepped portion on a side surface which connects the first main surface and the second main surface of the first semiconductor substrate, and
   an area of the first main surface of the first semiconductor substrate is larger than an area of the second main surface of the first semiconductor substrate.

3. The semiconductor differential pressure sensor according to claim 1, wherein
   the first semiconductor substrate has a trough-crest shaped region on the second main surface.

4. The semiconductor differential pressure sensor according to claim 1, wherein
   the semiconductor differential pressure sensor element is bonded to a case via a die bond material, and
   the case has a plurality of grooves in a portion thereof which is bonded to the other main surface of the first semiconductor substrate.

5. A semiconductor differential pressure sensor, comprising:
   a semiconductor differential pressure sensor element comprising a first semiconductor substrate and a second semiconductor substrate, wherein,
   a first main surface of the first semiconductor substrate and a first main surface of the second semiconductor substrate are bonded together via an oxide film formed on the second semiconductor substrate,
   the first semiconductor substrate comprises a depressed portion provided in the first main surface of the first semiconductor substrate, stress relaxation grooves provided around and along the depressed portion, and a pressure lead hole which allows the depressed portion to communicate with an external device on a side of a second main surface of the first semiconductor substrate,
   the second semiconductor substrate comprises a diaphragm defined by an outline of the depressed portion, strain sensitive elements disposed in on a second main surface of the second semiconductor substrate and inside the diaphragm, electrodes disposed in a frame portion outside the diaphragm, and diffusion wiring which electrically connects the strain sensitive elements and the electrodes, and
   the stress relaxation grooves have a nested structure in which the stress relaxation grooves surround the depressed portion.

6. A semiconductor differential pressure sensor, comprising:
a semiconductor differential pressure sensor element comprising a first semiconductor substrate and a second semiconductor substrate, wherein,
a first main surface of the first semiconductor substrate and a first main surface of the second semiconductor substrate are bonded together via an oxide film formed on the second semiconductor substrate,
the first semiconductor substrate comprises a depressed portion provided in the main surface of the first semiconductor substrate and a pressure lead hole which allows the depressed portion to communicate with an external device on a side of a second main surface of the first semiconductor substrate,
the second semiconductor substrate comprises a diaphragm defined by an outline of the depressed portion, strain sensitive elements disposed on a second main surface of the second semiconductor substrate and inside the diaphragm, electrodes disposed in a frame portion outside the diaphragm, and diffusion wiring which electrically connects the strain sensitive elements and the electrodes, and
the first semiconductor substrate has a trough-crest shaped region on a side surface which connects the first main surface and the second main surface of the first semiconductor substrate.

7. A semiconductor differential pressure sensor, comprising:
a semiconductor differential pressure sensor element comprising a first semiconductor substrate and a second semiconductor substrate, wherein,
a first main surface of the first semiconductor substrate and a first main surface of the second semiconductor substrate are bonded together via an oxide film formed on the second semiconductor substrate,
the first semiconductor substrate comprises a depressed portion provided in the first main surface of the first semiconductor substrate and a pressure lead hole which allows the depressed portion to communicate with an external device on a side of a second main surface of the first semiconductor substrate,
the second semiconductor substrate comprises a diaphragm defined by an outline of the depressed portion, strain sensitive elements disposed on a second main surface of the second semiconductor substrate and inside the diaphragm, electrodes disposed in a frame portion outside the diaphragm, and diffusion wiring which electrically connects the strain sensitive elements and the electrodes,
the pressure lead hole is in communication with the depressed portion via a communication hole, and
an opening cross-sectional area of the pressure lead hole is larger than a cross-sectional area of the communication hole.

8. A semiconductor differential pressure sensor comprising:
a semiconductor differential pressure sensor element comprising a first semiconductor substrate and a second semiconductor substrate, wherein,
a first main surface of the first semiconductor substrate and a first main surface of the second semiconductor substrate are bonded together via an oxide film formed on the second semiconductor substrate,
the first semiconductor substrate comprises a depressed portion provided in the first main surface of the first semiconductor substrate and a pressure lead hole which allows the depressed portion to communicate with an external device on a side of a second main surface of the first semiconductor substrate,
the second semiconductor substrate comprises a diaphragm defined by an outline of the depressed portion, strain sensitive elements disposed on a second main surface of the second semiconductor substrate and inside the diaphragm, electrodes disposed in a frame portion outside the diaphragm, and diffusion wiring which electrically connects the strain sensitive elements and the electrodes,
wherein the first semiconductor substrate further comprises a stopper, provided so as to be opposite to at least a central portion of the diaphragm, which suppresses a displacement of the diaphragm, and support beams which hold the stopper inside the pressure lead hole.

9. A manufacturing method of a semiconductor differential pressure sensor including a first semiconductor substrate and a second semiconductor substrate, wherein a first main surface of the first semiconductor substrate and a first main surface of a second semiconductor substrate are bonded together via an oxide film, the first semiconductor substrate includes a depressed portion, the second semiconductor substrate includes a diaphragm defined by an outline of the depressed portion, and the depressed portion is in communication with an external device on a side of a second main surface of the first semiconductor substrate through a pressure lead hole, the method comprising:
a depressed portion formation step which forms the depressed portion, which has therein a sacrificial column, by etching a region of the first main surface of the first semiconductor substrate to form the depressed portion in the first semiconductor substrate;
a bonding step which bonds the first main surface of the first semiconductor substrate and the first main surface of the second semiconductor substrate together, via the oxide film;
a diaphragm formation step which forms the diaphragm by thinning the second semiconductor substrate to a predetermined thickness from a side of a second main surface of the second semiconductor substrate;
a functional element formation step which forms, on the second semiconductor substrate in which is formed the diaphragm, strain sensitive elements disposed inside the diaphragm, electrodes disposed in a frame portion outside the diaphragm, and diffusion wiring which electrically connects the strain sensitive elements and the electrodes; and
a pressure lead hole formation step which forms the pressure lead hole and removes the sacrificial column simultaneously by etching the first semiconductor substrate so as to pass through from the second main surface of the first semiconductor substrate to a bottom surface of the depressed portion.

10. The semiconductor differential pressure sensor manufacturing method according to claim 9, wherein
the sacrificial column is of a hollow structure.

11. The semiconductor differential pressure sensor manufacturing method according to claim 9, wherein
the pressure lead hole formation step includes:
a step of forming a first protection film on the second main surface of the first semiconductor substrate, and removing and opening regions of the first protection film in which to form the pressure lead hole and in which to form a stepped portion of a side surface of the first semiconductor substrate;

a step of forming a second protection film on the first protection film of the first semiconductor substrate, and removing and opening a region of the second protection film in which to form the pressure lead hole;

a step of etching the first semiconductor substrate, on which the first protection film and second protection film are formed, by a first predetermined depth D1 from a side of the second main surface of the first semiconductor substrate, thus forming a first depressed portion of the first predetermined depth D1 to form the pressure lead hole in the first semiconductor substrate;

a step of removing the second protection film; and a step of etching the first semiconductor substrate, on which the first protection film is formed, by a second predetermined depth D2 which is a difference between a thickness of the first semiconductor substrate and the first predetermined depth D1, from the side of the second main surface of the first semiconductor substrate, thereby forming the stepped portion, which is positioned on the side surface at a distance D1 away from the first main surface of the first semiconductor substrate, and the pressure lead hole, and removing the sacrificial column at a same time when the stepped portion is formed.

* * * * *